(12) United States Patent
Fujii et al.

(10) Patent No.: US 10,928,555 B2
(45) Date of Patent: Feb. 23, 2021

(54) GLASS LAMINATE, FRONT PLATE FOR DISPLAY, DISPLAY DEVICE AND MANUFACTURING METHOD OF GLASS LAMINATE

(71) Applicant: AGC Inc., Chiyoda-ku (JP)

(72) Inventors: Kensuke Fujii, Tokyo (JP); Michinori Suehara, Tokyo (JP); Kazunari Tohyama, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/504,505

(22) Filed: Jul. 8, 2019

(65) Prior Publication Data

US 2020/0018872 A1 Jan. 16, 2020

(30) Foreign Application Priority Data

Jul. 12, 2018 (JP) .............................. JP2018-132157

(51) Int. Cl.
*B32B 17/06* (2006.01)
*G02B 1/115* (2015.01)
*C23C 14/08* (2006.01)
*C23C 14/18* (2006.01)
*G02B 1/18* (2015.01)

(52) U.S. Cl.
CPC .............. *G02B 1/115* (2013.01); *C23C 14/08* (2013.01); *C23C 14/18* (2013.01); *G02B 1/18* (2015.01)

(58) Field of Classification Search
CPC ..... C23C 14/08; C23C 14/18; C23C 16/4411; C23C 16/4585; C23C 16/466; G02B 1/115; G02B 1/18; B32B 17/06
See application file for complete search history.

(56) References Cited

U.S. PATENT DOCUMENTS

2015/0338552 A1 11/2015 Fujii et al.

FOREIGN PATENT DOCUMENTS

WO WO 2014/129333 A1 8/2014

*Primary Examiner* — Lawrence D Ferguson
(74) *Attorney, Agent, or Firm* — Oblon, McClelland, Maier & Neustadt, L.L.P.

(57) ABSTRACT

A glass laminate includes a glass substrate including a first main surface and a second main surface, an antireflection layer on at least one of the first main surface and the second main surface, and an antifouling layer on the antireflection layer. The antireflection layer includes at least one low refractive index layer and at least one high refractive index layer, and the low refractive index layer and the high refractive index layer being alternately laminated. The antireflection layer includes an outermost layer farthest from the glass substrate and the outermost layer is the low refractive index layer including $SiO_2$ as a main component. A distribution of fluorine concentration in a thickness direction of the outermost layer, measured by secondary ion mass spectrometry, has a peak.

12 Claims, 7 Drawing Sheets

AM: Antifouling Material

GLASS LAMINATE, FRONT PLATE FOR DISPLAY, DISPLAY DEVICE AND MANUFACTURING METHOD OF GLASS LAMINATE

CROSS-REFERENCE TO RELATED APPLICATIONS

This application claims priority from Japanese Patent Application No. 2018-132157 filed on Jul. 12, 2018, the entire subject matter of which is incorporated herein by reference.

BACKGROUND OF INVENTION

Technical Field

The present invention relates to a glass laminate, a front plate for display, a display device and a manufacturing method of a glass laminate.

Background Art

Cover glass is commonly used as a front plate of a touch panel and a display panel that are used in display devices such as smart phone, tablet PC and car navigation device. A laminate including a glass substrate, a low reflection film (antireflection layer) formed on one main surface of the glass substrate and an antifouling film formed on the low reflection film is commonly used as such a cover glass (for example, see Patent Literature 1).

In the laminate disclosed in Patent Literature 1, the laminate includes a transparent substrate, a low reflection film including high refractive index layers and low refractive index layers that are alternately formed on/above the transparent substrate, and an antifouling film formed on the low reflection film, and the antifouling film has surface roughness Ra of 3 nm or less, which leads to the improvement of durability of the antifouling film.

Patent Literature 1: WO2014/129333 A1

In the laminate disclosed in Patent Literature 1, durability of the antifouling film was improved by adjusting surface roughness Ra of the antifouling film, but durability of the low reflection film was not intended to be improved.

Therefore, the improvement in durability of an antireflection layer on which an antifouling layer is laminated is desired.

SUMMARY OF INVENTION

The present invention provides a glass laminate that can improve durability of an antireflection layer, a front plate for display, a display device and a manufacturing method of a glass laminate.

The present inventors have found that the glass laminate and manufacturing method of a glass laminate described below can overcome the above-described problems.
<1> A glass laminate, comprising:
 a glass substrate including a first main surface and a second main surface;
 an antireflection layer on at least one of the first main surface and the second main surface, the antireflection layer including at least one low refractive index layer and at least one high refractive index layer, the low refractive index layer and the high refractive index layer being alternately laminated; and
 an antifouling layer on the antireflection layer,
 wherein the antireflection layer includes an outermost layer farthest from the glass substrate and the outermost layer is the low refractive index layer including $SiO_2$ as a main component, and
 a distribution of fluorine concentration in a thickness direction of the outermost layer, measured by secondary ion mass spectrometry, has a peak.

The "main component" used herein means that its component is contained in an amount of 50 mass % or more in a layer (same applies hereinbelow). The "main component" above means that impurities excluding carbon atom may be contained in $SiO_2$ (silicon oxide).

The "peak" used herein means a vertex part in case where a graph in which a depth from the surface of an antireflection layer is X axis and secondary ion intensity is Y axis is prepared by secondary ion mass spectrometry (SIMS) and the distribution of fluorine concentration in the graph, that is, secondary ion intensity curve of fluorine, has a convex shape in the part of the outermost layer. The number of the convex shape is preferably one.

For example, the presence or absence of the peak in the outermost layer can be confirmed by the following procedures.

(1) Straight line LA is set in parallel to Y axis at the measurement point at which secondary ion intensity of silicon (Si) and secondary ion intensity of oxygen (O) in the outermost layer does not change greatly and begins to be flat when observed toward a depth direction from the surface of the antireflection layer, that is, a direction of the glass substrate, and an intersection of the straight line LA and the secondary ion intensity of fluorine is indicated as A (see FIG. 9).

(2) Straight line LB is set in parallel to Y axis at the point at which the secondary ion intensity of a material constituting the second layer as the high refractive index layer, for example, $Nb^-+O^-$, rapidly rises and from which the secondary ion intensity of silicon (Si) start to decrease, and an intersection of the straight line LB and the secondary ion intensity curve of fluorine is designated as B (see FIG. 9).

(3) Straight line LC being a base contacting from below to secondary ion intensity curve of fluorine in a range connecting the intersection A and the intersection B is set (see FIG. 9).

The point with which the straight line LC contacts from below is two minimum values on the secondary ion intensity curve and is the point at which the secondary ion intensity curve does not intersect with a line connecting those minimum values. When the secondary ion intensity curve is complicated and a plurality of straight lines connecting two contact points are present, a straight line having the largest distance between two points is the straight line LC.

(4) The point giving the maximum value of the secondary ion intensity curve of fluorine within the section of two contact points C and D of the straight line LC set in (3) above and the secondary ion intensity curve of fluorine, that is, between the contact point C and the contact point D, is determined. When a plurality of contact points are present, the point farthest from the straight line LC set in (3) is used (see FIG. 9).

(5) The distance between the point giving the maximum value set in (4) and the straight line LC set in (3) is divided equally, and a straight line LE in parallel to the straight line LC set in (3) is set so as to pass through the equally dividing point E (see FIG. 9).

(6) When the straight line LE set in (5) intersects with the secondary ion intensity curve of fluorine at one or two points between the contact point C and the contact point D, a point giving the maximum value set in (4) is the peak P (see FIG. 9).

By setting as above, even when the secondary ion intensity curve is slant or has a little noise, the presence or absence of the peak can be simply and easily confirmed. In particular, the vicinity of the intersection A and intersection B is the switching part of layers and the secondary ion intensity curve rapidly changes. Therefore, noise is easy to be generated. When the noise of secondary ion intensity is large, leveling treatment is preferably performed with Savitzky-Golay method.

From the standpoint of sufficiently obtaining the effect of relaxing stress, when the ion intensity at the point at which a straight line drawn in parallel to Y axis from the peak P intersects with the straight line LC is ion intensity on the straight line as a base, the maximum value is preferably larger than two times of the ion intensity on the straight line.

The outermost layer of the antireflection layer contains $SiO_2$ as a main component. Therefore, when compressive stress increases, film peeling may occur.

In an aspect of the present invention, fluorine-rich portion is formed in the outermost layer, that is, inside $SiO_2$ film. By forming the fluorine-rich portion, stress in the $SiO_2$ film is once relaxed in the fluorine-rich portion. As a result, stress of the whole $SiO_2$ film is relaxed as compared with the case where fluorine is rich, and the progress of scratches and peeling of a film itself can be prevented.

<2> The glass laminate according to the above <1>, wherein the antifouling layer includes a fluorine atom.

In this constitution, fluorine atoms are used for forming the antifouling layer on the antireflection layer, and the fluorine atoms are contained in a part of the outermost layer of the antireflection layer. For this reason, a glass laminate capable of achieving the above-described effect can be easily manufactured without separately using an apparatus supplying fluorine in the formation of the antireflection layer. The glass laminate may be manufactured by using a glass laminate having a fluorine-containing antireflection layer formed in the outermost layer.

Furthermore, a friction coefficient decreases by forming the antifouling layer on the outermost layer, and transmission of external force to the film is reduced. As a result, the effect of reducing damages to a film is achieved, and this is preferred.

<3> The glass laminate according to the above <1> or <2>, wherein the outermost layer has a thickness of 60 nm or more and 130 nm or less.

In this embodiment, when the outermost layer has the thickness in the above range, both antireflection effect and stress relaxation can be achieved.

<4> The glass laminate according to any one of the above <1> to <3>, wherein the number of the low refractive index layer in the antireflection layer is 1 or more and 6 or less, and the number of the high refractive index layer in the antireflection layer is equal to that of the low refractive index layer.

The number of the layers in the antireflection layer is preferably 12 or less in total.

The above total number of the low refractive index layers and high refractive index layers in the antireflection layer is preferred from the standpoints of achieving the function as the antireflection layer.

<5> The glass laminate according to the above <4>, wherein the number of each of the low refractive index layer and the high refractive index layer in the antireflection layer is 1, and a main component of the high refractive index layer is any one of $SiN$, $TiO_2$, $Nb_2O_5$, $Ta_2O_5$ and $ZrO_2$.

When such a main component is used, reflectance can be effectively reduced even in the glass laminate including only one low refractive index layer and only one high refractive index layer.

<6> The glass laminate according to the above <4>, wherein the number of each of the low refractive index layer and the high refractive index layer in the antireflection layer is 2 or more and 6 or less, a main component of the high refractive index layer is any one of $SiN$, $TiO_2$, $Nb_2O_5$, $Ta_2O_5$ and $ZrO_2$, and the main component of all of the high refractive index layers is the same or the main component of at least one of the high refractive index layers is different from the main component of the other high refractive index layer(s).

When such a main component is used, the glass laminate having the desired antireflection performance can be provided even with the less number of the low refractive index layers and the high refractive index layers.

<7> The glass laminate according to any one of <1> to <6>, wherein the antifouling layer is formed from a fluorine-based silane coupling material.

In this embodiment, even when fingers or the like of human touch the glass laminate, stains by fingerprints, sebum, sweat or the like are difficult to be adhered to the glass laminate by virtue of the antifouling layer, and even when stains are adhered to the glass laminate, stains can be easily removed. As a result, difference in scattering and reflection of light between the part to which stains are adhered and the part to which stains are not adhered is reduced, and this does not impair visibility and beauty.

<8> The glass laminate according to the above <7>, wherein the number of each of the low refractive index layer and the high refractive index layer in the antireflection layer is 2 or more and 6 or less, a content of the $SiO_2$ in a range from the outermost surface of the outermost layer to a depth of 5 nm from the outermost surface is 95 mass % or more, and a main component of the low refractive index layer(s) other than the outermost layer is $Al$—$SiO_2$.

In this embodiment, a content of the $SiO_2$ in the range from the outermost surface of the outermost layer to a depth of 5 nm or less from the outermost surface is 95 mass % or more. Therefore, the outermost surface of the outermost layer is a pure $SiO_2$ layer, the antifouling layer is formed from a fluorine-based silane coupling material can chemically bond to the $SiO_2$ surface in high density, and water repellency is improved. Furthermore, by constituting such that the layers other than the outermost layer in the low refractive index layers includes $Al$—$SiO_2$, deposition rate during deposition is improved and deposition troubles such as arcing can be prevented. As a result, productivity is improved. With regard to the Al content, when the weight ratio between Al and Si, i.e. Al/(Si+Al), is more than 5%, effective productivity is improved and this is preferred. The weight ratio is more preferably more than 6%. When the weight ratio Al/(Si+Al) is less than 15%, the refractive index of the film after deposition does not increase and satisfactory reflection properties are obtained, which is preferred. The weight ratio is more preferably less than 10%.

<9> The glass laminate according to any one of <1> to <8>, wherein antiglare processing has been applied to the main surface of the glass substrate on which the antireflection layer is laminated.

In this embodiment, an antiglare layer is formed on the main surface of the glass substrate. Therefore, reflection and reflection image of the glass substrate can be effectively prevented.

<10> A front plate for display, comprising the glass laminate according to any one of <1> to <9>.

The "display" used herein means image display devices such as liquid crystal display (LCD), plasma display panel (PDP), electroluminescence display (ELD), cathode ray tube display (CRT), surface-conduction electron-emitter display (SED) and the like. Of those, examples of ELD include organic electroluminescence (organic EL). The display preferably means in-vehicle display and more preferably in-vehicle display using LCD or ELD.

<11> A display device, comprising the front plate for display according to <10>.

<12> A method for manufacturing a glass laminate, wherein the glass laminate comprises:

a glass substrate including a first main surface and a second main surface;

an antireflection layer on at least one of the first main surface and the second main surface, the antireflection layer including at least one low refractive index layer and at least one high refractive index layer, the low refractive index layer and the high refractive index layer being alternately laminated; and an antifouling layer that is in contact with the antireflection layer and includes a fluorine atom, wherein the antireflection layer includes an outermost layer farthest from the glass substrate and the outermost layer is the low refractive index layer including $SiO_2$ as a main component, wherein the method comprises:

forming the outermost layer excluding a part of the outermost layer in a thickness direction in the antireflection layer above the glass substrate by a first apparatus; and continuously forming the part of the outermost layer in a thickness direction and the antifouling layer by a second apparatus different from the first apparatus.

The low refractive index layers and the high refractive layers are alternately laminated on/above the glass substrate by the first apparatus and the outermost layer excluding a part of the outermost layer in a thickness direction in the antireflection layer, that is, a base layer part which is the outermost layer excluding a layer upper part located at the top of the part of the outermost layer, is formed. The main component of the outermost layer is $SiO_2$. The remaining part of the antireflection layer, that is, the part of the outermost layer in a thickness direction, is formed on the already deposited part in the outermost layer, and the antifouling layer containing fluorine atoms is then formed.

In the deposition by the second apparatus, fluorine discharged in the chamber beforehand for condition check remains inside the second apparatus even before forming the antifouling layer. Therefore, fluorine remained is adsorbed on $SiO_2$ surface at the time when the substrate is placed in a vacuum chamber. Thus, very thin fluorine layer is formed in the $SiO_2$ layer. When the layer upper part is then formed, $SiO_2$ layer is formed on the very thin fluorine layer and a peak of fluorine is formed in an intermediate portion of the $SiO_2$ film as the outermost layer. The $SiO_2$ film is once separated in the intermediate portion by the thin fluorine layer, so that stress of the whole outermost layer is relaxed as compared with the case where fluorine is not present in the outermost layer. Therefore, even when scratches are generated on the outermost layer, the progress of scratches is prevented in the part having high fluorine concentration.

As a result, scratches are prevented from propagating up to the high refractive index layer and durability of the antireflective layer is improved.

The glass laminate having the feature that the distribution of fluorine concentration in a thickness direction of the outermost layer, measured by the measurement with secondary ion mass spectrometry, has a peak can be manufactured by the method described above.

When the antifouling layer is arranged on the outermost surface, friction coefficient is decreased and the effect that damages to a film is reduced by reducing transmission of external force to the film is achieved. This is preferred.

DETAILED DESCRIPTION OF THE INVENTION

Embodiments of the present invention are described in detail below by reference to the drawings.
<Glass Laminate>
(Schematic Structure of Glass Laminate)

Figure 1:
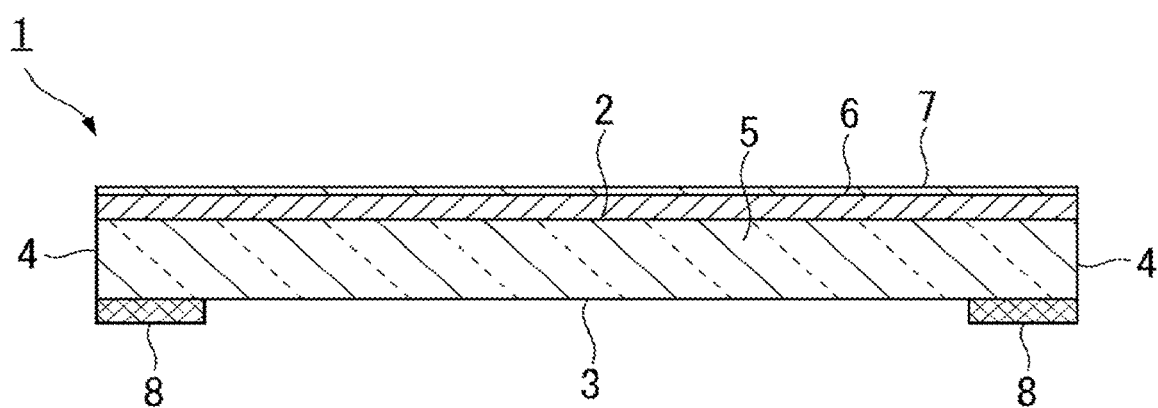
FIG. 1 is a schematic cross-sectional view of a glass laminate in one embodiment of the present invention.

FIG. 1 is a schematic cross-sectional view of a glass laminate.

In FIG. 1, a glass laminate 1 includes a glass substrate 5 including a first main surface 2 and a second main surface 3 that are opposite to each other, and an edge surfaces 4 connecting the first main surface 2 and the second main surface 3.

An antireflection layer 6 and an antifouling layer 7 are laminated in this order on/above the first main surface 2 of the glass substrate 5. The glass laminate 1 further includes a print layer 8 at a periphery of the second main surface 3. The print layer 8 is not essential and is provided as necessary.
(Glass Substrate)
(Materials)

As the glass substrate 5, for example, a common glass including $SiO_2$ (silicon oxide) as a main component, for example, a glass substrate including soda lime silicate glass, aluminosilicate glass, borosilicate glass, non-alkali glass, quartz glass or the like can be used.

(Shape)

The shape of the glass substrate 5 used in the glass laminate 1 is not only a flat shape as shown in FIG. 1, but may be a shape having a curved surface as in a glass having at least one bent portion. Recently, in various instruments including an image display device, such as television, personal computers, smart phones and car navigations, instruments including a curved display surface of an image display device are commercially available.

The glass laminate 1 having a shape that the glass substrate 5 has a curved surface is useful as a glass laminate for such an image display device. For example, when the glass laminate 1 is prepared using a glass having bent portions and having a U-shaped cross-section and the prepared glass laminate is used as a front plate of a mobile phone and the like, frequency of touch to the glass laminate 1 by users is increased. As a result, the antifouling layer 7 may be gradually peeled and the effect of preventing adhesion of stains may be decreased. The glass substrate 1 in this embodiment has excellent abrasion resistance and is useful in the uses.

When the glass substrate 5 has a curved surface, the whole surface of the glass substrate 5 may be curved and the surface of the glass substrate 5 may be constituted of a curved surface part and a flat surface part. Example of the case where the whole surface is curved includes a case where the cross-section of the glass substrate is an arc shape.

When the glass substrate 5 has a curved surface, radius of curvature (hereinafter referred to as "R") of the surface can be appropriately set depending on uses of the glass laminate 1, kind of the glass substrate 5, and the like. The radius of curvature is preferably 25,000 mm or less, more preferably 1 to 5,000 mm and particularly preferably 5 to 3,000 mm. When R is equal to or less than the above-described upper limit, designability is excellent as compared with a flat plate. When R is equal to or more than the above-described lower limit, the antifouling layer 7 can be uniformly formed even on the curved surface.

(Thickness)

Thickness of the glass substrate 5 can be appropriately selected depending on uses. The thickness of the glass substrate 5 is preferably 0.1 mm to 5 mm, more preferably 0.2 mm to 2 mm and still more preferably 0.5 mm to 2 mm. When the thickness of the glass substrate 5 is 5 mm or less, in the case of applying chemical strengthening treatment to the glass substrate 5, the treatment can be effectively carried out, and both weight reduction and high strength can be achieved. The thickness of the glass substrate 5 is more preferably 3 mm or less from the standpoint of effectively conducting the chemical strengthening treatment. Furthermore, when the thickness of the glass substrate 5 is 1 mm or more, excellent strength is obtained when used in a touch panel. When the thickness of the glass substrate 5 is 2 mm or less, excellent sensitivity is obtained when used in a touch panel.

(Antireflection Layer)
(Layer Structure)

Figure 2A:
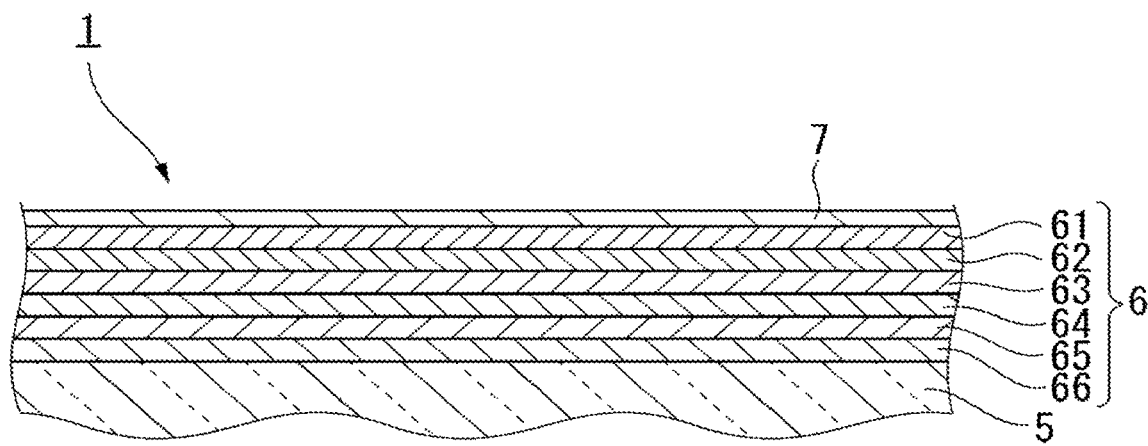
FIG. 2A is a cross-sectional view of a major part of a glass laminate.

FIG. 2A is an enlarged view of the antireflection layer 6.

The antireflection layer 6 is a layer that brings about the effect of reducing refractive index and reduces glare caused by reflection image of light, and additionally in the case of using in an image display device, the antireflection layer 6 can improve transmittance of light through the image display device and can improve visibility of the image display device.

The structure of the antireflection layer 6 may be a structure that can reduce reflection of light, and may be, for example, a structure in which high refractive index layers having a refractive index of 1.9 or more at a wavelength of 550 nm and low refractive index layers having a refractive index of 1.6 or less at a wavelength of 550 nm are alternately laminated. As the number of the low refractive index layers and the high refractive index layers, it is preferred that the number of the low refractive index layers is 1 or more and 6 or less and the number of the high refractive index layers is same as that of the low refractive index layers. FIG. 2A shows the antireflection layer constituted of three low refractive index layers and three high refractive index layers. The antireflection layer may be constituted of one low refractive index layer and one high refractive index layer.

In the case where the antireflection layer 6 is constituted of a plurality of the low refractive index layers and a plurality of the high refractive index layers, when a layer farthest from the glass substrate 5, that is, a layer in contact with the antifouling layer 7, is defined as the outermost layer 61 and layers are counted toward the glass substrate side from the outermost layer 61 being a first layer, odd layers including the outermost layer 61, specifically, the outermost layer 61, a third layer 63 and a fifth layer 65 in FIG. 2A, are constituted of the low refractive index layer. When a layer adjacent to the outermost layer 61 and is towards the glass substrate side from the outermost layer 61 is defined as a second layer 62, even layers including the second layer 62, specifically, the second layer 62, a fourth layer 64 and a sixth layer 66 in FIG. 2A, are constituted of the high refractive index layer. The high refractive index layer farthest from the outermost layer 61, specifically the sixth layer 66 in FIG. 2A, is in contact with the glass substrate 5.

When the antireflection layer is constituted of one low refractive index layer and one high refractive index layer, the low refractive index layer is the outermost layer 61 and the high refractive index layer is the second layer 62.

The antireflection layer 6 has a thickness of 100 nm or more and 600 nm or less, preferably 140 nm or more and 550 nm or less and more preferably 178 nm or more and 506 nm or less.

(Outermost Layer)

The outermost layer 61 has a thickness of 60 nm or more and 130 nm or less and preferably 70 nm or more and 120 nm or less. When the thickness of the outermost layer 61 is 60 nm or more, desired antireflection properties can be obtained and when the thickness is 130 nm or less, peeling by stress is difficult to occur.

Examples of the measurement method of thickness of the outermost layer 61 include the measurement of actual thickness by cross-sectional observation based on SEM (Scanning Electron Microscopy) or TEM (Transmission Electron Microscopy) and the optical measurement by ellipsometry. When an antiglare treatment has been applied to the outermost layer, the actual thickness is preferably measured using SEM or TEM. Furthermore, when the refractive index of each layer is known, the thickness can be derived from spectral reflectance or transmittance (reference literature: "Optical thin film and deposition technology", Author: Ri Seichu, translator: ULVAC, Inc., published from AGUNE Gijutsu Center, 2002). In particular, when the refractive index of each layer is known, the thickness is preferably measured by spectral reflectance.

The measurement method of the thickness can be applied to the measurement of thicknesses of the entire antireflection layer, each layer in the antireflection layer and the antifouling layer. However, the antifouling layer is very thin. Therefore, the thickness is preferably derived by removing a part of the antifouling layer by the method described hereinafter and then seeing the difference by optical measurement (Reference Literature: WO2016/068112 A1, paragraphs [0125] to [0129]).

The outermost layer 61 is preferably a carbon-containing silicon oxide layer containing $SiO_2$ (silicon oxide) as a main component and having a carbon concentration of $5\times10^{18}$ atoms/cm$^3$ or more and $5\times10^{19}$ atoms/cm$^3$ or less.

When carbon atoms are not contained, the refractive index of silicon oxide of the outermost layer 61 is generally 1.43 or more and 1.50 or less. The outermost layer may contain impurities to an extent such that the refractive index thereof is 1.40 or more and 1.53 or less and preferably 1.45 or more and 1.52 or less.

Since the main component of the outermost layer 61 is a carbon-containing silicon oxide layer in the above-described range, the antifouling layer 7 is strongly adhered to the glass substrate 5 through the antireflection layer 6. As a result, the glass laminate 1 has excellent abrasion resistance.

The outermost layer 61 may contain F (fluorine atom) and other atoms, in addition to silicon oxide.

Figure 2B:
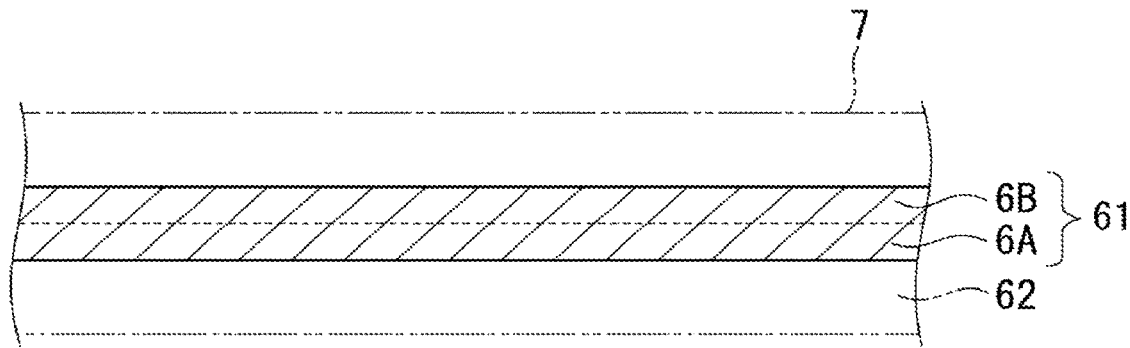
FIG. 2B is a schematic cross-sectional view of an outermost layer.

In the outermost layer 61, the distribution of fluorine concentration in a thickness direction of the antireflection layer 6 has a peak P inside the outermost layer 61 as described hereinafter (see FIG. 8 and FIG. 9). In other words, as shown in FIG. 2B, the outermost layer 61 is constituted of a base layer part 6A adjacent to a second layer 62 and a layer upper part 6B formed on the base layer part 6A and present on the uppermost side. The outermost layer 61 has a peak P of the distribution in the vicinity of the boundary between the base layer part 6A and the layer upper part 6B.

The layer upper part 6B has a thickness of preferably 10 nm or more and 50 nm or less. When the thickness is 10 nm or more, density of silanol groups to react with the antifouling layer can be maintained and satisfactory water repellency is obtained. On the other hand, when the thickness is 50 nm or less, the thickness of the layer upper part 6B itself is appropriate to obtain the effect of stress relaxation. The thickness of the layer upper part 6B is more preferably 10 nm or more and 40 nm or less. The thickness of the layer upper part 6B is most preferably 10 nm or more and 30 nm or less.

Any one of the odd layers including the outermost layer 61 may be $Al—SiO_2$ (aluminum-doped silicon oxide) containing silicon oxide doped with aluminum.

The main component of the high refractive index layer constituting the second layer 62 is preferably at least one selected from SiN (silicon nitride), $TiO_2$ (titanium oxide), $Nb_2O_5$ (niobium oxide), $Ta_2O_5$ (tantalum oxide) and $ZrO_2$ (zirconium oxide). Of those materials, from the standpoints of productivity and refractive index, silicon nitride, niobium oxide and tantalum oxide are more preferred, and niobium oxide is most preferred.

The main component of the even layers of the fourth layer and odd layer(s) following the fourth layer, for example, the fourth layer 64 and the sixth layer 66, may be the same as that of the second layer 62 and may be a material different from the second layer 62. When the main component constituting the second layer 62 is niobium oxide, the fourth layer 64 and odd layer(s) following the fourth layer 64 may be niobium oxide as same as the second layer 62 and may be a material different from the second layer 62.

(Surface Roughness)

The surface roughness of the outermost layer 61 is preferably 3 nm or less, more preferably 2 nm or less and still more preferably 1.5 nm or less, in terms of arithmetic mean roughness (Ra). When Ra is 3 nm or less, cloth and the like can be deformed along a concave-convex shape of the antifouling layer 7 and a load is nearly uniformly applied to the entire surface of the antifouling layer 7. As a result, it is considered that peeling of the antifouling layer is prevented and abrasion resistance is improved.

The arithmetic mean roughness (Ra) is a value obtained by averaging absolute value deviations from a reference plane in a roughness curve included in a reference length on the reference plane. The surface approaches complete smooth surface as Ra approaches 0. Ra can be measured in accordance with the method defined in, for example, JIS B 0601: (2001). As the specific measurement method of Ra, a visual field range of 3 μm×3 μm is set to a measurement surface of the glass substrate 5 after forming the antireflection layer 6 as a sample by a scanning probe microscope (Model: SPA400, manufactured by Seiko Instruments) and plane profile of the glass substrate 5 is measured. Ra can be calculated from the plane profile measured.

When the first main surface 2 of the glass substrate 5 has a concave-convex shape, root mean square roughness (RMS) of the outermost layer 61 in contact with the antifouling layer 7 in the antireflection layer 6 is preferably 10 nm or more and more preferably 20 nm or more, in terms of the lower limit, and is preferably 1500 nm or less, more preferably 1000 nm or less, still more preferably 500 nm or less and particularly preferably 200 nm or less, in terms of the upper limit. When the RMS is within the range, peeling of the antifouling layer 7 is prevented and abrasion resistance is improved, and in addition to those, both antidazzle property and antiglare property can be achieved. The "dazzle" used herein means the degree that when the glass substrate 5 having a concave-convex shape on any one of the first main surface 2 and the second main surface 3 is used in a display front plate of a pixel matrix type display device, many particles of light having period larger than that of the pixel matrix are observed and visibility is impaired by this.

In measuring RMS of a concave-convex shape, measurement region may be selected such that many circular holes are sufficiently contained in the measurement region, contrary to the measurement of the arithmetic means roughness (Ra) of the antireflection layer 6 described above. Furthermore, the surface roughness of the antireflection layer 6 and the antifouling layer 7 is sufficiently smooth as described above. Therefore, it may be considered that the value of RMS measured by the above-described method is the same value as RMS of the concave-convex shape in the state that the antireflection layer 6 and the antifouling layer 7 are present.

The root mean square roughness (RMS) can be measured in accordance with the method defined in JIS B 0601: (2001). As the specific measurement method of RMS, a visual field range of 300 μm×200 μm is set to the measurement surface of the glass substrate 5 after antiglare treatment as a sample and height information of the glass substrate 5 is measured, by a laser microscope (trade name: VK-9700, manufactured by Keyence). Cutoff correction is not performed to the measurement value, root mean square of the height obtained is obtained, and RMS can be calculated. The cutoff value preferably uses 0.08 mm. Haze value is a value measured by the definition of JIS K 7136: 2000.

When the first main surface 2 having a concave-convex shape is observed from above, circular holes are observed. A size of the circular holes observed, that is, a diameter in terms of a true circle, is preferably 5 to 50 μm. When the diameter is within the range, both antidazzle property and antiglare property of the glass laminate 1 can be achieved.

When measuring arithmetic mean roughness (Ra) of the antireflection layer, in the case where the first main surface 2 of the glass substrate 5 has a concave-convex shape, the measurement region may be set such that the concave-convex shape is not influenced. When a diameter of circular holes and root mean square roughness (RMS) are within the above preferred ranges, Ra of the antireflection layer can be measured by, for example setting the measurement region to a region excluding a ridge line of convex-concave. For example, when the first main surface 2 has a concave-convex shape, the measurement region is preferably selected in such a manner that a fine region of 1 µm×1 µm is selected and measured such that the concave-convex shape is not measured, in measuring Ra or RMS of the antireflection layer.

(Antifouling Layer)

The antifouling layer 7 is a layer preventing organic materials or inorganic materials from being adhered to the surface thereof, or a layer bringing about the effect that adherents can be easily removed by cleaning such as wiping-off even in a case where organic materials or inorganic materials are adhered to the surface.

When the antifouling layer 7 includes a fluorine-containing organosilicon compound coating film, the antifouling layer 7 has a thickness of 2 nm or more and 20 nm or less, preferably 2 nm or more and 15 nm or less and more preferably 2 nm or more and 10 nm or less. Above all, the thickness is preferably 2 nm or more and 8 nm or less, and more preferably 2 nm or more and 6 nm or less, and particularly preferably 4 nm. When the thickness is 2 nm or more, the first main surface 2 of the glass substrate 5 is uniformly covered with the antifouling layer 7, and the glass laminate withstands practical use from the standpoint of rubbing resistance. When the thickness is 20 nm or less, optical properties such as haze value of the glass laminate 1 in the state that the antifouling layer 7 has been formed are satisfactory.

When the thickness of the antifouling layer 7 is about 2 nm or more and about 20 nm or less, the antifouling layer 7 is thin. Therefore, the concave-convex structure of the surface of the antifouling layer 7 is formed since the surface shape of the antireflection layer 6 is traced as it is. For this reason, it can be considered that the arithmetic mean roughness (Ra) of the antifouling layer 7 is equal to Ra of the antireflection layer 6. Furthermore, it can be considered that the root mean square roughness (RMS) of the antifouling layer 7 is equal to RMS of the antireflection layer 6. Therefore, the surface roughness (Ra or RMS) of the antireflection layer 6 can be measured by Ra or RMS of the glass laminate 1 after forming the antifouling layer 7. However, when the first main surface 2 of the glass substrate 5 has a concave-convex shape, the measurement region is preferably selected in such a manner that a fine region of 1 µm×1 µm is selected and measured such that the concave-convex shape is not measured, in measuring Ra or RMS of the antireflection layer 7.

The antifouling layer 7 may be any material so long as it has water repellency and oil repellency and can impart antifouling property to the glass laminate 1 obtained. For example, the antifouling layer preferably includes a fluorine-containing organosilicon compound coating film obtained by subjecting a fluorine-containing organosilicon compound including a fluorine-based silane coupling material to hydrolysis condensation reaction.

The antifouling layer 7 is formed as follows: a fluorine-containing hydrolyzable silicon compound such as a fluorine-containing organosilicon compound undergoes hydrolysis condensation reaction as follows on the surface of the antireflection layer 6 formed on the first main surface 2 of the glass substrate 5, and has water repellency and oil repellency. In the present description, the fluorine-containing hydrolyzable silicon compound means a compound having a hydrolyzable silyl group having hydrolyzable group or atom bonded to silicon atom and further having a fluorine-containing organic group to be bonded to the silicon atom. The hydrolyzable group or atom constituting the hydrolyzable silyl group by bonding to the silicon atom is collectively called a "hydrolyzable group".

Specifically, hydrolyzable silyl groups of the fluorine-containing hydrolyzable silicon compound convert to silanol groups by hydrolysis, those groups are dehydration condensed between molecules to form a siloxane bond represented by —Si—O—Si—, and then, a fluorine-containing organosilicon compound coating film is formed. In the fluorine-containing organosilicon compound coating film, almost all of the fluorine-containing organic groups bonded to silicon atom of the siloxane bond is present in the vicinity of the surface of the coating film on the side of the antireflection layer 6, and water repellency and oil repellency can be developed by the action of the fluorine-containing groups. In this case, the silanol groups are chemically bonded to hydroxyl groups on the surface of the antireflection layer 6 on the side of the antifouling layer 7, that is a surface on which the antifouling layer 7 is formed, that is, on the surface of a silicon oxide layer, by dehydration condensation reaction, thereby forming points adhered through siloxane bond. Thus, in the glass laminate 1, the antifouling layer 7 is strongly bonded to the glass substrate 5 through the antireflection layer 6, and as a result, the glass laminate 1 has excellent antifouling property.

The fluorine-containing hydrolyzable silicon compound is a compound having fluorine-containing organic groups to be bonded to silicon atoms, and may be a fluorine-containing silicon compound having silanol groups. In this case, the same effect as above is obtained.

(Print Layer)

The print layer 8 may be provided as necessary so as to shield wiring circuits arranged in the vicinity of an outer periphery of a display device of mobile equipment and an adhered part between a housing of mobile instruments and the glass laminate 1 for the purpose of enhancing visibility of display and beauty. The print layer 8 may be provided at a periphery of the second main surface 3 of the glass laminate 1.

The periphery used herein means a band-shaped area having a specific width toward a central part from an outer periphery. The print layer 8 may be provided on the entire periphery of the second main surface 3 (see FIG. 3 and FIG. 4) and may be provided on a part of the periphery.

When the glass laminate 1 includes the print layer 8, the print layer 8 can be appropriately set to have a width that can shield the wiring circuits and adhered part. As the color of the print layer 8, desired color can be selected depending on the purpose. The print layer 8 is formed by, for example, a method of printing an ink.

Examples of the ink that can be used include an inorganic ink containing ceramic sintered body and the like, and an organic ink containing a color material such as a dye or a pigment and an organic resin.

For example, when the print layer 8 is formed with black color, examples of ceramics contained in an inorganic black ink include oxides such as chromium oxide and iron oxide, carbides such as chromium carbide and tungsten carbide, carbon black and mica. The black print layer 8 is obtained by melting an ink including the ceramics and silica, printing desired patterns with the ink and drying the patterns. The inorganic ink requires melting and drying steps and is generally used as a glass-only ink.

The organic ink is a composition containing a dye or pigment having a desired color and an organic resin. Examples of the organic resin include homopolymers such as an epoxy resin, an acrylic resin, polyethylene terephthalate, polyether sulfone, polyacrylate, polycarbonate, an acrylonitrile-butadiene-styrene (ABS) resin, a phenol resin, a transparent ABS resin, polyurethane, polymethyl methacrylate, polyvinyl-based resin, polyvinyl butyral, polyether ether ketone, polyethylene, polyester, polypropylene, polyamide and polyamide, and resins including copolymers of monomers of those resins and copolymerizable monomers.

Of the inorganic inks and organic inks, the organic ink is preferably used from the standpoint of low drying temperature. The organic ink containing pigment is preferably used from the standpoint of resistance to chemicals.

<Manufacturing Method of Glass Laminate>

Each step in the manufacturing method of the glass laminate 1 in an aspect of the present invention is described below.

(Formation of Antireflection Layer and Antifouling Layer)
(Sticking of Pressure-Sensitive Adhesive and Carrier Substrate)

Figure 3:
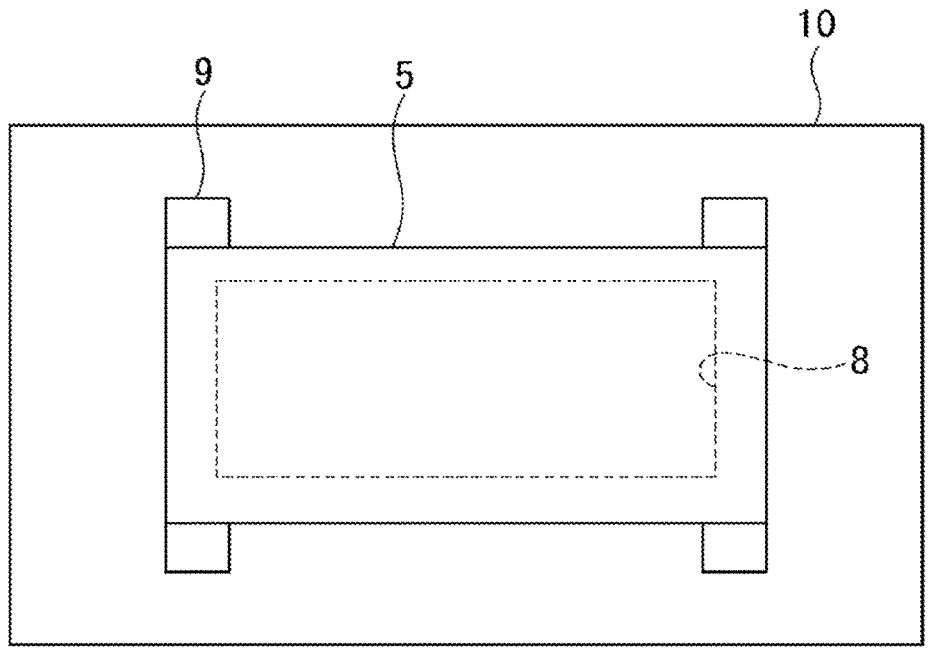
FIG. 3 is a schematic plain view of a glass substrate in the state that a pressure-sensitive adhesive and a carrier substrate have been adhered to the glass substrate.

As shown in FIG. 3, a band-shaped pressure-sensitive adhesive 9 including a carbon-containing material is adhered to the second main surface 3 (see FIG. 1) of the glass substrate 5, and a carrier substrate 10 is stuck on the surface of the pressure-sensitive adhesive 9.

The shape of the pressure-sensitive adhesive 9 may be a shape such as a hook shape, in addition to a band shape shown in FIG. 3. Furthermore, the pressure-sensitive adhesive 9 may be adhered to the glass substrate 5 in continuous or intermittent manner.

When the glass substrate 5 has the print layer 8 thereon, the pressure-sensitive adhesive 9 is stuck on the surface of the print layer 8, but when the glass substrate 5 does not have the print layer 8, the pressure-sensitive adhesive 9 is directly stuck on the second main surface 3.

At least one the glass substrate 5 is held on one carrier substrate 10.

(Another Example of Sticking of Pressure-Sensitive Adhesive and Carrier Substrate)

Figure 4:
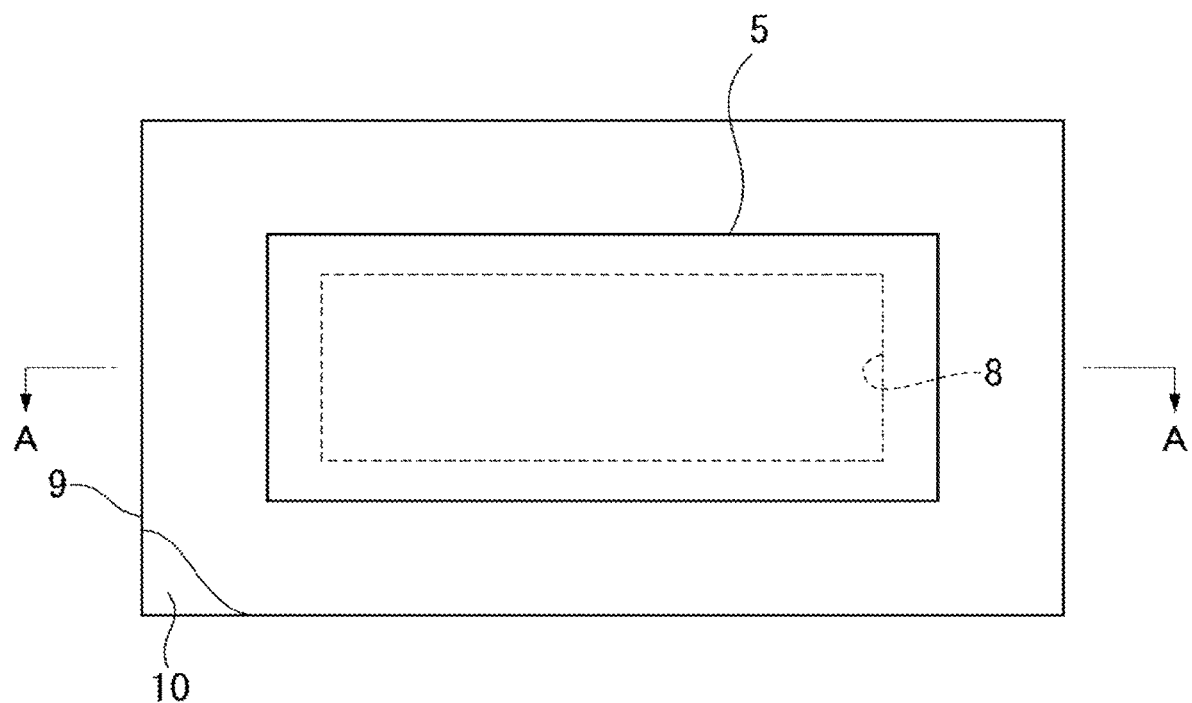
FIG. 4 is a schematic plain view of a glass substrate in the state that a pressure-sensitive adhesive and a carrier substrate have been adhered to the glass substrate in another embodiment.
Figure 5:
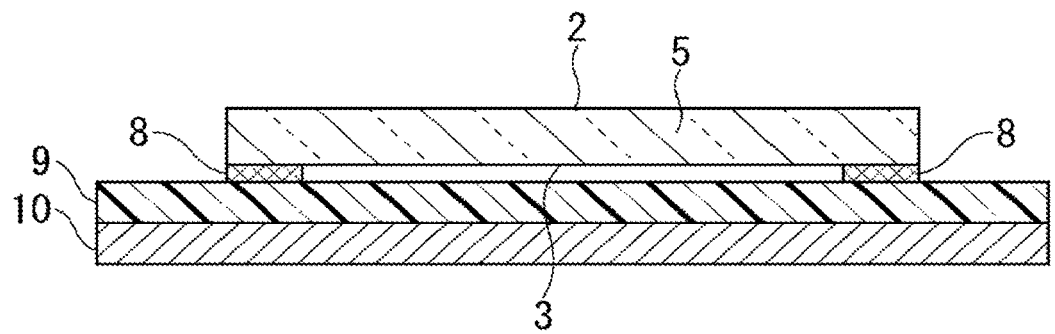
FIG. 5 is a cross-sectional view of the glass substrate, taken along A-A line of the glass substrate shown in FIG. 4.

FIG. 4 schematically shows another example of the arrangement of the pressure-sensitive adhesive layer 9 and the carrier substrate 10 with respect to the glass substrate 5 when the pressure-sensitive adhesive layer 9 and the carrier substrate 10 are stuck. FIG. 5 is a cross-sectional view of the glass substrate, taken along line A-A of the glass substrate shown in FIG. 4.

In FIG. 4, the pressure-sensitive adhesive 9 is adhered to the entire surface of the carrier substrate 10 to which the glass substrate 5 is stuck, and the glass substrate 5 is stuck on the pressure-sensitive adhesive 9. Thus, the pressure-sensitive adhesive 9 may be adhered to the entire surface of one main surface of the carrier substrate 10, and the glass substrate 5 may be stuck thereto.

Examples of the material of the pressure-sensitive adhesive 9 include silicone-based pressure-sensitive adhesives using silicone rubber or silicone resin, acrylic pressure-sensitive adhesives prepared by polymerizing or copolymerizing monomers of at least one of acrylic acid esters, and polyurethane-based pressure-sensitive adhesives using polyurethane. When the glass laminate 1 is assembled in mobile instruments or the like, the glass laminate is adhered to a display device such as mobile instruments, or a housing by an adhesive or the like on the side of the second main surface 3. For this reason, the second main surface 3 preferably has low water repellency and oil repellency from the standpoint of adhesiveness. From this point, of the materials described above, acrylic and polyurethane-based pressure-sensitive adhesives are preferred as the material of the pressure-sensitive adhesive 9.

The pressure-sensitive adhesive 9 has an adhesive force of preferably 0.02 N/25 mm to 0.4 N/25 mm and more preferably 0.05 N/25 mm to 0.2 N/25 mm in terms of a value in the measurement of adhesive force to an acryl plate in 180° peeling defined in JIS Z 0237: 2009 from the standpoints of the balance between adhesive force between the glass substrate 5 or print layer 8 and the carrier substrate 10 and peelability of the pressure-sensitive adhesive 9 when removing the pressure-sensitive adhesive 9 and the carrier substrate 10 after formation of the antifouling layer.

The pressure-sensitive adhesive 9 preferably has a thickness of 5 µm to 50 µm from the standpoints of adhesive force between the glass substrate 5 or print layer 8 and the carrier substrate 10, and peelability.

The pressure-sensitive adhesive 9 may has a substrate. Examples of the substrate include a polyimide resin, a polyethylene terephthalate (PET) resin, a polyethylene resin and a polypropylene resin. Of those, a polyimide resin and a polyethylene terephthalate (PET) resin are preferably used from the standpoint of heat resistance.

The carrier substrate 10 may be any material so long as it has strength to an extent that the glass substrate 5 can be maintained in a vertical state or a horizontal state while holding the glass substrate and it can withstand the conditions such as temperature, pressure and atmosphere for forming the antireflection layer 6 and the antifouling layer 7, and the carrier substrate made of a glass, a resin, a metal or the like can be used. As the shape of the carrier substrate 10, a plate-shaped or film-shaped substrate can be used. When the carrier substrate 5 has a curved surface, the carrier substrate 10 may be processed into a shape corresponding to the second main surface 3 of the glass substrate 5.

Specifically, a polyethylene terephthalate (PET) resin, a polyethylene resin and a polypropylene resin are preferably used as the carrier substrate 10 made of a resin. As the carrier substrate 10 made of a resin, a polyimide resin and a PET resin are preferred from the standpoint of heat resistance, and of those, a PET resin is preferred from the standpoint of cost. The carrier substrate 10 made of a resin preferably has a film shape, and the films of the above resins are preferably used.

The carrier substrate 10 to which the pressure-sensitive adhesive 9 has been applied, such as a pressure-sensitive adhesive-attached protective film, may be used. In this case, the pressure-sensitive adhesive-attached film is continuously supplied and put on the second main surface 3 using a laminating machine while conveying the glass substrate 5, and pressure is then applied to stick the film to the glass substrate. The pressure-sensitive adhesive-attached film is stuck on the second main surface 3 under the conditions, for example, that a conveying speed of the glass substrate 5 is 1 mm/min to 5 mm/min and pressure applied is 1 kgf/cm$^2$ to 10 kgf/m$^2$ in linear pressure.

Examples of the carrier substrate 10 provided with the pressure-sensitive adhesive 9 include No. 6500 (trade name, manufactured by Hitachi Maxell, Ltd.) as a silicone-based pressure-sensitive adhesive-attached polyimide tape, RP-207 (trade name, manufactured by Nitto Denko Corporation) as an acrylic pressure-sensitive adhesive-attached PET film and UA-3004AS (trade name, manufactured by Sumiron Co., Ltd.) as a polyurethane-based pressure-sensitive adhesive-attached PET film. The substrate can be efficiently held by using the carrier substrate 10 provided with the pressure-sensitive adhesive 9.

When the pressure-sensitive adhesive 9 has sufficient holding force to the glass substrate 5, the pressure-sensitive adhesive 9 further has the function of the carrier substrate 10. Therefore, the carrier substrate 10 may not separately be used.

The size of the carrier substrate 10 is preferably larger than the second main surface 3 of the glass substrate 5 from the standpoint of holding force to the glass substrate 5. When the carrier substrate 5 is larger than the glass substrate 5, in the case where the antireflection layer 6 is formed by sputtering, a material forming the antireflection layer achieves the edge surfaces 4 in the course of sputtering and the antireflection layer 6 is formed on the edge surfaces 4. When the antifouling layer 7 is formed by deposition, the antireflection layer forming material achieves the edge surfaces 4 in the course of deposition and the antireflection layer 7 is formed on the edge surfaces 4. Thus, the antireflection layer 6 is formed on the region of from the first main surface 2 of the glass substrate 5 to the edge surfaces 4. In this case, the antireflection layer 6 and the antifouling layer 7 can develop the respective functions, and those layers are provided on the large part on the first main surface 2 and the edge surfaces 4. In this embodiment, microcracks on the edge surfaces 4 are prevented from occurring, and high strength can be imparted to the glass laminate 1.

The carrier substrate 10 having a size smaller than the area of the second main surface 3 may be used. In this case, for example, the antireflection layer 6 is formed by sputtering in the state that the glass substrate 5 is stuck on the carrier substrate 10 having a size smaller than the area of the second main surface 3, and the antifouling layer 7 is formed by deposition. Thus, the antireflection layer 6 can be formed up to the vicinity of the outer periphery of the outermost surface on the side of the second main surface 3.

(Structure of Deposition Apparatus for Antireflection Layer and Antifouling Layer)

Figure 6:
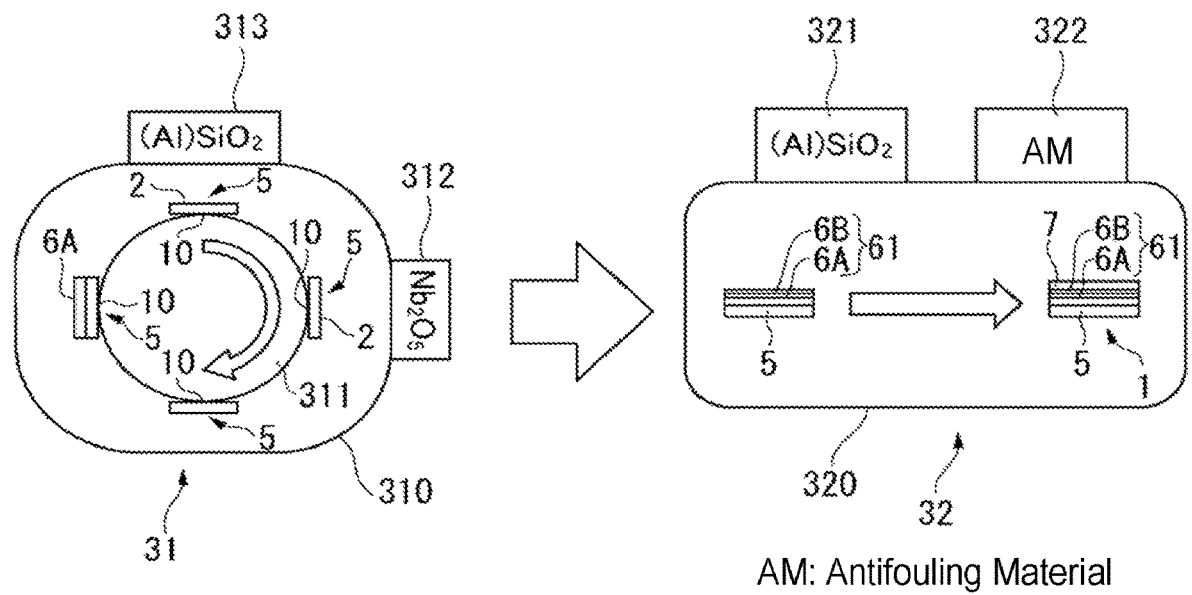
FIG. 6 is a schematic view of a first apparatus and a second apparatus as one example.

As shown in FIG. 6, the deposition apparatus includes a first apparatus 31 and a second apparatus 32. In this embodiment, a part of the outermost layer 61 in a thickness direction in the antireflection layer 6, that is, a base layer part 6A which is the outermost layer excluding a layer upper part 6B, is formed on the glass substrate 5 using the first apparatus 31, and the layer upper part 6B of the outermost layer 61 and the antifouling layer 7 are then continuously formed by the second apparatus 32 different from the first apparatus 31.

The first apparatus 31 includes a chamber 310, a drum 311 rotatably provided in the chamber 310, a sputtering mechanism 312 for high refractive index layer for forming a high refractive index layer on the glass substrate 5 attached to the drum 311, and a sputtering mechanism 313 for low refractive index layer for forming low refractive index layer.

A plurality of the glass substrates 5 are detachably mounted on the drum 311. In FIG. 6, the thickness of the carrier substrate 10 is decreased and the print layer 8 and the pressure-sensitive adhesive 9 are omitted.

By the sputtering mechanism 312 for high refractive index layer, an antireflection layer forming material containing $Nb_2O_5$ is sputtered to form a high refractive index layer.

By the sputtering mechanism 313 for a low refractive index layer, an antireflection layer forming material containing silicon oxide is sputtered toward the first main surface 2 to form a low refractive index layer. The sputtering mechanism 313 for low refractive index layer may be a mechanism in which an antireflection layer forming material containing Al—$SiO_2$ doped with aluminum is sputtered to form a low refractive index layer.

The second apparatus 32 includes a chamber 320, the part (not shown) to which the glass substrate 5 is detachably attached, a sputtering mechanism 321 in which an antireflection layer forming material containing silicon oxide is sputtered on the base layer part 6A to form a layer upper part 6B, and a deposition mechanism 322 for forming the antifouling layer 7 on the layer upper part 6B.

The sputtering mechanism 321 has the same structure as in the sputtering mechanisms 312 and 313 of the first apparatus 31.

The deposition mechanism 322 includes a heating vessel (not shown) for heating a coating film forming composition outside the chamber 320, piping (not shown) for supplying vapor of the coating film forming composition into the chamber 320, and a manifold (not shown) having an injection port for injecting the vapor supplied through the piping. In this embodiment, in the deposition mechanism 322, an antifouling material containing a fluorine-containing hydrolyzable silicon compound as a coating film forming composition is deposited.

(Formation of Antireflection Layer)

The sputtering mechanism 312 for high refractive index layer is operated while rotating the drum 311 having the glass substrate 5 mounted thereon, and high refractive index layer having a specific thickness, for example, a sixth layer 66 in FIG. 2A, is formed on the glass substrate 5.

Thereafter, the rotation of the drum 311 and the operation of the sputtering mechanism 312 for high refractive index layer are stopped, and the sputtering mechanism 313 for low refractive index layer is then operated while rotating the drum 311 to form a low refractive index layer (fifth layer 65 in FIG. 2A) on the high refractive index layer (sixth layer 66). The rotation of the drum 311 and the operation of the sputtering mechanism 313 for low refractive index layer are stopped, and layers up to a second layer 62 are then formed while alternately operating the sputtering mechanism 312 for high refractive index layer and the sputtering mechanism 313 for low refractive index layer as described above. Furthermore, layers up to the base layer part 6A in the outermost layer 61 are formed on the second layer 62.

After completion of the deposition step in the first apparatus 31, the glass substrate 5 having the antireflection layer 6 formed up to the base layer part 6A is taken out of the first apparatus 31 and arranged in the second apparatus 32, and the remaining deposition step is carried out.

The sputtering mechanism 321 is operated to form the layer upper part 6B on the base layer part 6A. In this deposition, fluorine atoms are present in the chamber 320 of the second apparatus 32 by the deposition step by the deposition mechanism 322 previously conducted. Therefore, the fluorine atoms are incorporated in a boundary part between the base layer part 6A and the layer upper part 6B. As a result, the antireflection layer 6 having a peak P present in the distribution of fluorine concentration in the outermost layer 61 is formed.

In the formation of the antireflection layer 6, a dense film having high durability can be formed by using a sputtering method. The deposition is particularly preferably conducted by a sputtering method such as a pulse sputtering method, an AC sputtering method or a digital sputtering method.

For example, in the case of conducting deposition by a pulse sputtering method, the glass substrate 5 is arranged in a chamber having a mixed gas atmosphere of inert gas and oxygen gas, a target is selected so as to have a desired composition as a antireflection layer forming material, and the deposition is conducted. In this case, various inert gases such as argon and helium can be used as gas species of the inert gas in the chamber.

When the pressure in the chamber by a mixed gas of inert gas and oxygen gas is set to a range of 0.5 Pa or less, surface roughness of the film to be formed is easy to be set to a preferred range. This is considered to be due to the following reasons. When the pressure in the chamber by a mixed gas of inert gas and oxygen gas is 0.5 Pa or less, mean free path of deposited molecules is ensured and the deposited molecules reach the substrate with more energy. As a result, it is considered that rearrangement of deposited molecules is promoted and a relatively dense film having a smooth surface can be formed. In terms of the lower limit of the pressure in the chamber by a mixed gas of inert gas and oxygen gas, the pressure is preferably, for example, 0.1 Pa or more.

By exposing to heating and plasma, carbon components contained in the pressure-sensitive adhesive volatilize and are incorporated in a silicon oxide layer. Therefore, a layer having fluorine (F) and the like incorporated in a silicon oxide layer can be formed by selecting a material constituting the pressure-sensitive adhesive. Furthermore, when a silicon oxide layer is formed using a material containing an element to be incorporated in the silicon oxide layer, other than the pressure-sensitive adhesive, in the state that the material is exposed to heat and plasma, the silicon oxide layer having the element incorporated therein can be formed.

When the high refractive index layer and low refractive index layer are formed by a pulse sputtering method, the thickness of each layer can be adjusted by adjusting discharge power, deposition time and the like.

(Formation of Antifouling Layer)

The glass substrate 5 having the antireflection layer 6 formed thereon is conveyed from the left side to the right side in the second apparatus 32 of FIG. 6 by conveying means not shown, and a deposition step by the deposition mechanism 322 is conducted. Thus, the antifouling layer 7 containing a fluorine-containing organosilicon compound is formed.

When the antifouling layer 7 is formed, the pressure maintained in the chamber 320 is preferably 1 Pa or less and more preferably 0.1 Pa or less, from the standpoint of production stability. Vacuum deposition by a resistance heating method can be carried out under the pressure without problem.

The heating temperature of the composition for coating film formation by a heating vessel is preferably 30° C. to 400° C. and particularly preferably 150° C. to 350° C. When the heating temperature is equal to or more than the lower limit of the above range, deposition rate is satisfactory. When the heating temperature is equal to or less than the upper limit of the above range, a coating film having antifouling property can be formed on the first main surface 2 of the glass substrate 5 without occurrence of decomposition of a fluorine-containing hydrolyzable silicon compound.

In the above method, the following pretreatment is preferably conducted when conducting the vacuum deposition: the coating film forming composition containing a fluorine-containing hydrolyzable silicon compound is heated in the heating vessel up to a deposition initiation temperature, and then, its vapor is discharged outside the system for a specific time. The pretreatment can remove low molecular weight component and the like generally contained in the fluorine-containing hydrolyzable silicon compound and affecting durability of the coating film obtained, and further makes it possible to stabilize the composition of raw material vapor supplied from deposition source. This makes it possible to stably form the fluorine-containing organosilicon compound coating film having high durability. The temperature of the glass substrate 5 during the vacuum deposition is preferably a range of from room temperature (20° C. to 25° C.) to 200° C. When the temperature of the glass substrate 5 is 200° C. or lower, deposition rate is satisfactory. The upper limit of the temperature of the glass substrate 5 is more preferably 150° C. and particularly preferably 100° C.

Thus, the coating film forming composition containing a fluorine-containing hydrolyzable silicon compound is adhered to the antireflection layer 6 of the glass substrate 5. Furthermore, the fluorine-containing hydrolyzable silicon compound undergoes hydrolysis condensation reaction simultaneously with the adhesion or after adhesion, and then, the fluorine-containing hydrolyzable silicon compound chemically bonds to the antireflection layer 6 and additionally undergoes siloxane bond between molecules, thereby forming a fluorine-containing organosilicon compound coating film.

The hydrolysis condensation reaction of the fluorine-containing hydrolyzable silicon compound proceeds on the surface of the antireflection layer 6 simultaneously with the adhesion. To further sufficiently accelerate the reaction, as necessary, the glass substrate 5 having the fluorine-containing organosilicon compound coating film formed thereon may be taken out of the chamber 320 and then subjected to a heat treatment using a hotplate or a thermo-hygrostat bath. Example of the heat treatment includes a heat treatment at a temperature of 80° C. to 200° C. for 10 minutes to 60 minutes.

The glass laminate 1 thus obtained has excellent antifouling property such as water repellency or oil repellency, and additionally, the antifouling layer has high abrasion resistance. The glass laminate 1 is provided to constitute the front plate 1A for display.

(Antiglare Treatment)

Antiglare treatment can be applied to the glass substrate 5. A method of subjecting the first main surface 2 of the glass substrate 5 to a surface treatment by a chemical method or a physical method to form concave-convex shape having a desired surface roughness can be used as the antiglare treatment. Furthermore, as the antiglare treatment, a coating liquid for antiglare film is applied or sprayed to the first main surface of the glass substrate 5 to deposit an antiglare film on the glass substrate 5, thereby forming a concave-convex shape.

Specific examples of the antiglare treatment by a chemical method include a method of applying a frost treatment. The frost treatment is conducted by, for example, dipping the glass substrate 5 as a material to be treated in a mixed solution of hydrogen fluoride and ammonium fluoride.

The antiglare treatment by a physical method is conducted by, for example, a so-called sandblast method of blowing crystalline silicon dioxide powder, silicon carbide powder or the like to the surface of the glass substrate 5 with pressurized air or a method of wetting a brush having crystalline silicon dioxide powder, silicon carbide powder or the like adhered thereto with water and polishing the surface of the glass substrate 5 using the brush.

Above all, the frost treatment as a chemical surface treatment is preferably used since microcracks are difficult to be generated on the surface of a material to be treated and strength of the glass substrate 5 is difficult to decrease.

The first main surface 2 of the glass substrate 5 to which the antiglare treatment has been applied is preferably subjected to an etching treatment in order to shape its surface. For example, a method of dipping the glass substrate 5 in an etching solution as an aqueous solution of hydrogen fluoride to chemically etch the glass substrate can be used as the etching treatment. The etching solution may contain an acid such as hydrochloric acid, nitric acid or citric acid, in addition to hydrogen fluoride. When those acids are contained in the etching solution, local generation of precipitates by the reaction between a cationic component such as Na ion or K ion contained in the glass substrate 5 and hydrogen fluoride can be prevented, and additionally, etching uniformly proceeds within the treating surface.

When the etching treatment is conducted, etching amount is adjusted by adjusting the concentration of the etching solution, the dipping time of the glass substrate 5 in the etching solution, and the like, thereby adjusting the haze value of the antiglare-treated surface of the glass substrate 5 to a desired value. When the antiglare treatment is conducted by a physical surface treatment such as sandblasting treatment, cracks may be generated. However, cracks can be removed by the etching treatment. Furthermore, the effect of preventing glare of the glass laminate 1 is obtained. When the glass substrate 5 is cut into a desired size, the glass substrate is preferably cut after the antiglare treatment and before the next chemical strengthening treatment.

As a method of applying a coating liquid for antiglare film for the antiglare treatment, common wet coating methods can be used, and examples thereof include spray coating, electrostatic coating, spin coating, dip coating, die coating, curtain coating, screen coating, ink jetting, flow coating, gravure coating, bar coating, flexo coating, slit coating and roll coating.

Above all, the spray coating and electrostatic coating are exemplified as an excellent method of depositing an antiglare film. Antiglare film can be formed by treating the glass substrate 5 by a spraying apparatus using a coating liquid for antiglare film. Thus, the antiglare treatment of the glass substrate 5 can be performed. According to spray coating, the haze value and the like can be changed in wide range. This is because concave-convex shape necessary for obtaining required properties can be relatively easily formed by freely changing the amount of the coating liquid or the material constitution. In particular, electrostatic coating is more preferred.

The coating liquid for antiglare film may contain particles. Examples of the particles include metal oxide particles, metal particles, pigment particles and resin particles.

Examples of the material of the metal oxide particles include $Al_2O_3$, $SiO_2$, $SnO_2$, $TiO_2$, $ZrO_2$, $ZnO$, $CeO_2$, Sn-containing SnOx (antimony-containing tin oxide, ATO), Sn-containing $In_2O_3$ (ITO) and $RuO_2$. $SiO_2$ is preferred for the reason that its refractive index is the same as that of the matrix.

Examples of the material of metal particles include metals (Ag, Ru and the like) and alloys (AgPd, RuAu and the like).

Examples of the pigment particles include inorganic pigments such as titanium black and carbon black, and organic pigments.

Examples of the material of the resin particles include acrylic resin, polystyrene and melamine resin.

Examples of the shape of the particles include scaly shape, spherical shape, elliptical shape, needle shape, plate shape, bar shape, conical shape, columnar shape, cubic shape, rectangular shape, diamond shape, star shape and amorphous shape. For other particles, each particle may be present in the independent state, each particle may be connected in chain state, and each particle may be agglomerated.

The particles may be solid particles, may be hollow particles and may be perforated particles such as porous particles.

Examples of scaly particles include scaly silica ($SiO_2$) particles, scaly alumina ($Al_2O_3$) particles, scaly titania ($TiO_2$) particles and scaly zirconia ($ZrO_2$) particles. Scaly silica particles are preferred from the standpoints that the increase of a refractive index of the film is prevented and reflectance is decreased.

Preferred examples of other particles include silica particles such as spherical silica particles, bar-shaped silica particles and needle-like silica particles. Above all, spherical silica particles are preferred and porous spherical silica particles are more preferred, from the standpoints that the haze of an antiglare fil-attached substrate is sufficiently increased, 60° specular gloss on the surface of the antiglare film sufficiently decreases, and as a result, antiglare effect is sufficiently achieved.

In the electrostatic coating method, the coating liquid for antiglare film is electrostatically charged and sprayed using an electrostatic spraying apparatus including an electrostatic spraying gun. Droplets of the coating liquid for antiglare film sprayed from the electrostatic spraying gun are negatively charged, and therefore are attracted toward the ground glass substrate by electrostatic attraction. As a result, the droplets are efficiently adhered to the glass substrate 5 as compared with the case of spraying without electrostatically charging.

One kind of the antiglare treatment may be conducted alone, and two or more kinds of the antiglare treatments may be conducted in combination. For example, the antiglare treatment by an etching treatment or a spray coating method using a coating liquid is generally conducted alone, but those treatments may be combined.

(Chemical Strengthening Treatment)

The glass substrate 5 may be chemically strengthened. Examples of the chemically strengthening method include a method of subjecting the surface of the glass substrate 5 to ion exchanging to form a surface layer having compressive stress remained therein. Specifically, alkali metal ions having small ionic radius contained in the glass of the surface of the glass substrate 5, for example, Li ions and Na ions, are substituted with alkali metal ions having larger ionic radius, for example, Na ions or K ions for Li ions, and K ions for Na ions, at a temperature being equal to or less than the glass transition temperature. By the substitution, compressive stress remains in the surface of the glass substrate 5, thereby improving strength of the glass substrate 5.

(Formation of Print Layer)

A print layer can be formed on the glass substrate 5. For example, an ink is printed on the second main surface 3 of the glass substrate 5 to form the print layer 8. Examples of the printing method include bar coating method, reverse coating method, gravure coating method, die coating method, roll coating method, screen method and inkjet coating method. The screen printing method is preferred from the points that the ink is easily and simply printed, the ink can be printed on various substrates and the ink can be printed depending on a size of the glass substrate 5. The print layer 8 may be a multilayer including a laminate of a plurality of layers, and may be a single layer. When the print layer 8 is multilayer, the print layer 8 can be formed by repeating printing and drying of the ink.

<Effects of Glass Laminate>

The glass laminate 1 includes the glass substrate 5, the antireflection layer 6 on at least one main surface of two main surfaces of the glass substrate 5, the antireflection layer 6 including at least one low refractive index layer and at least one high refractive index layer that are alternately laminated, and the antireflection layer 7 in contact with the antireflection layer 6, and an outermost layer 61 farthest from the glass substrate 5 in the antireflection layer 6 is the low refractive index layer containing $SiO_2$ as a main component, and a distribution of fluorine concentration in a thickness direction of the antireflection layer has a peak inside the outermost layer 61. The outermost layer 61 containing $SiO_2$ as a main component. Therefore, compressive stress is increased and film peeling may occur. However, stress is once relaxed in the outermost layer 61 because a peak of distribution of fluorine concentration is present in the outermost layer 61. Therefore, from the standpoint of the stress of the entire film, the stress is small as compared with the case where fluorine is not present, scratches are prevented from propagating to the high refractive index layer on the side of the glass substrate, and durability of the antireflection layer is improved.

<Effects of Manufacturing Method of Glass Laminate>

In the method for manufacturing the glass laminate 1 including the glass substrate 5, the antireflection layer 6 on at least one main surface of two main surfaces of the glass substrate 5, the antireflection layer 6 including at least one low refractive index layer and at least one high refractive index layer that are alternately laminated, and the antifouling layer 7 in contact with the antireflection layer 6 and containing fluorine atoms, in which the outermost layer 61 farthest from the glass substrate 5 in the antireflection layer 6 is the low refractive index layer containing $SiO_2$ as a main component, the method including forming the outermost layer 61 excluding a part of the outermost layer 61 in a thickness direction in the antireflection layer 6 above the glass substrate 5 by the first apparatus 31, and continuously forming the part of the outermost layer 61 in a thickness direction and the antifouling layer 7 by the second apparatus 32 different from the first apparatus 31. In forming the layer upper part 6B containing $SiO_2$ as a main component on the part that has already been formed, by the second apparatus 32, fluorine atoms remaining in the chamber 320 of the second apparatus 32 are contained in the vicinity of the boundary between the base layer part 6A and the layer upper part 6B of the outermost layer 61, and a peak of distribution of fluorine concentration is present in the outermost layer 61. Therefore, when manufacturing the glass laminate 1 having the above effects, an apparatus for supplying fluorine is not separately required, and as a result, an apparatus for deposition can be simplified.

<Display Device>

One example of the display device 11 including the glass laminate 1 manufactured by the above steps is described below by reference to FIG. 7. Examples of the display device in this embodiment include a display device such as an in-vehicle car navigation system and a mobile display device such as a smart phone.

Figure 7:
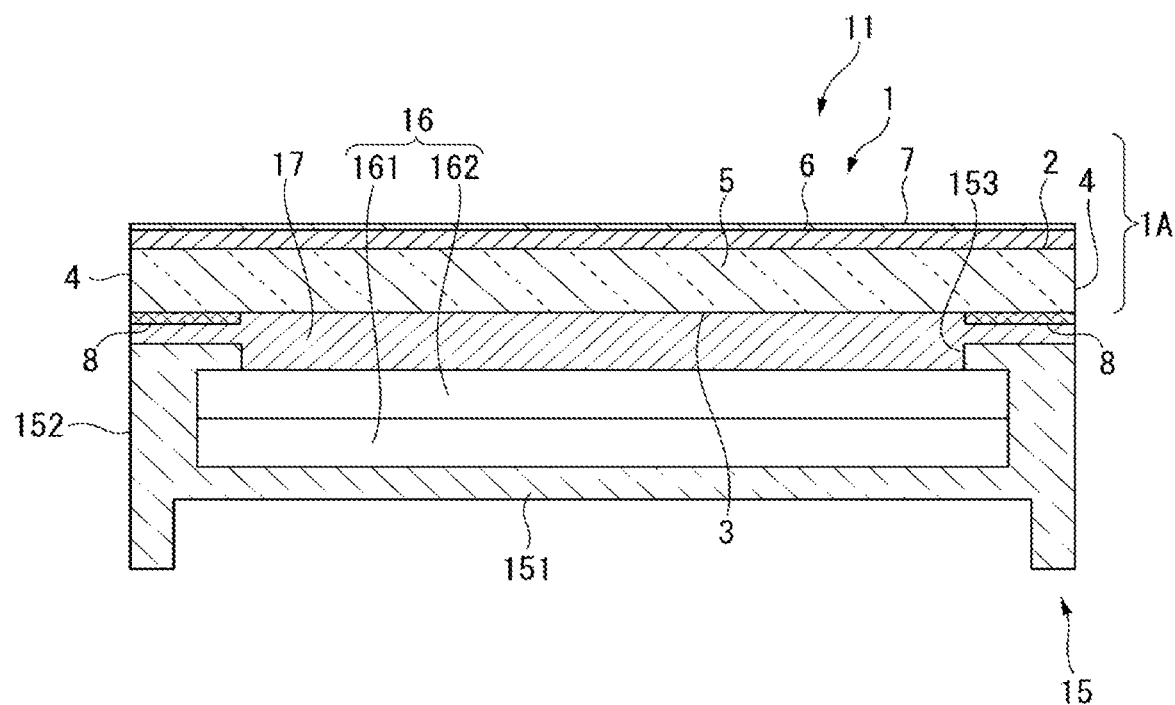
FIG. 7 is a schematic cross-sectional view of a display device in one embodiment of the present invention.

The display device 11 shown in FIG. 7 is one example of an in-vehicle display device. The display device 11 includes a frame 15. The frame 15 includes a bottom 151, a side wall 152 intersecting with the bottom 151 and an opening 153 facing the bottom 151. A liquid crystal module 16 is arranged in the space surrounded by the bottom 151 and the side wall 152. The liquid crystal module 16 includes, for example, a backlight 161 arranged on the side of the bottom 151 and a liquid crystal panel 162 as a display panel arranged on the backlight 161. The liquid crystal panel 162 includes, for example, IPS liquid crystal, and is an in-cell type having an element having touch function embedded in a liquid crystal element.

The front plate 1A for display including the glass laminate 1 is provided at the upper edge of the frame 15. The front plate 1A for display is adhered to the frame 15 and the liquid crystal module 16 through the adhesive layer 17 provided on the opening 153 and the upper edge face of side wall 152.

The adhesive layer 17 preferably is transparent and has small difference in refractive index to a chemically strengthened glass. Example of the adhesive layer 17 includes a layer including a transparent resin obtained by curing a liquid curable resin composition. Examples of the curable resin composition include a photocurable resin composition and a thermocurable resin composition. Of those, a photocurable resin composition containing a curable compound and a photopolymerization initiator is preferred. The curable resin composition is applied, for example, by a method such as die coater or roll coater to form a curable resin composition film.

The adhesive layer 17 may be OCA film (OCA tape).

<Modification of Glass Substrate>

(Composition)

The composition of the glass of the glass substrate 5 is preferably a composition which allows the glass substrate to be formed and strengthened by chemical strengthening treatment, and preferably contains alkali metals having small ionic radius, such as sodium and lithium. Specific preferable examples of the glass include aluminosilicate glass, soda lime silicate glass, borosilicate glass, lead glass, alkali barium glass and aluminoborosilicate glass.

Glasses having various compositions can be used as the glass composition of the glass substrate 5. Examples of the glass composition include the following glass compositions. All of the compositions are aluminosilicate glass.

(i) A glass having a composition containing, in terms of mol %, 50% to 80% of $SiO_2$, 2% to 25% of $Al_2O_3$, 0% to 10% of $Li_2O$, 0% to 18% of $Na_2O$, 0% to 10% of $K_2O$, 0% to 15% of MgO, 0% to 5% of CaO and 0% to 5% of $ZrO_2$ (ii) A glass having a composition containing, in terms of mol %, 50% to 74% of $SiO_2$, 1% to 10% of $Al_2O_3$, 6% to 14% of $Na_2O$, 3% to 11% of $K_2O$, 2% to 15% of MgO, 0% to 6% of CaO and 0% to 5% of $ZrO_2$, in which the total content of $SiO_2$ and $Al_2O_3$ is 75% or less, the total content of $Na_2O$ and $K_2O$ is 12% to 25% and the total content of MgO and CaO is 7% to 15%

(iii) A glass having a composition containing, in terms of mol %, 68% to 80% of $SiO_2$, 4% to 10% of $Al_2O_3$, 5% to 15% of $Na_2O$, 0% to 1% of $K_2O$, 4% to 15% of MgO and 0% to 1% of $ZrO_2$ (iv) A glass having a composition containing, in terms of mol %, 67% to 75% of $SiO_2$, 0% to 4% of $Al_2O_3$, 7% to 15% of $Na_2O$, 1% to 9% of $K_2O$, 6% to 14% of MgO and 0% to 1.5% of $ZrO_2$, in which the total content of $SiO_2$ and $Al_2O_3$ is 71% to 75%, the total content of $Na_2O$ and $K_2O$ is 12% to 20% and when CaO is contained, its content is less than 1%

A glass containing coloring components (e.g. oxides of metal such as Co, Mn, Fe, Ni, Cu, Cr, V, Bi, Se, Ti, Ce, Er and Nd) to an extent such that visibility is not impaired may be used as the glass substrate 5.

(Production Method)

The glass substrate 5 can be produced by, for example, adding desired glass raw materials to a continuous melting furnace, melting the glass raw materials at a temperature of preferably 1500° C. to 1600° C., clarifying the resulting melt, supplying the melt to a molding apparatus, molding the molten glass into a plate shape, and slowly cooling the resulting molding.

Examples of the molding method of the glass substrate 5 include downdraw processes such as overflow downdraw process, slotdown process and redraw process, and molding processes such as float process, rollout process and press process.

(Chemical Strengthening Treatment) The glass substrate 5 is preferably strengthened by a physical strengthening treatment or chemical strengthening treatment, and is more preferably strengthened by the chemical strengthening treatment.

The glass substrate 5 having been subjected to a chemical strengthening treatment has, for example, surface compressive stress (CS) of 450 MPa to 1200 MPa and a depth of stress layer (DOL) of 10 μm to 50 μm.

(Imparting of Antiglare)

The first main surface 2 of the glass substrate 5 used in the glass laminate 1 preferably has a concave-convex shape for imparting antiglare to the glass laminate 1.

The concave-convex shape is formed by, for example, an antiglare treatment and an etching treatment. As the shape of the first main surface 2 having a concave-convex shape, the surface roughness is preferably 10 nm to 1500 nm, more preferably 10 nm to 1000 nm, still more preferably 10 nm to 500 nm and particularly preferably 10 nm to 200 nm, in terms of root mean square roughness (RMS). When RMS is within the above range, the haze value of the first main surface 2 having concave-convex shape can be adjusted to 3 to 30%, and as a result, excellent antiglare can be imparted to the glass laminate 1 obtained.

<Modification of Antifouling Layer>

The coating film forming composition for forming the antifouling layer 7 is a composition containing a fluorine-containing hydrolyzable silicon compound, and may be any composition so long as it is a composition capable of forming a coating film by vacuum deposition. The coating film forming composition may contain optional components other than the fluorine-containing hydrolyzable silicon compound and may be constituted of only the fluorine-containing hydrolyzable silicon compound. Examples of the optional components include a fluorine atom-free hydrolyzable silicon compound (hereinafter referred to as a "non-fluorine hydrolyzable silicon compound) and a catalyst, and those are used in an amount that does not impair the effects of the present invention.

When the fluorine-containing hydrolyzable silicon compound and optionally the non-fluorine hydrolyzable silicon compound are added to the coating film forming composition, each compound may be added as it is or may be added as a partially hydrolyzed condensate thereof. Furthermore, a mixture of the compound and its partially hydrolyzed condensate may be added to the coating film forming compound.

When two or more kinds of hydrolyzable silicon compounds are used in combination, each compound may be added to the coating film forming composition as it is, may be added as each partially hydrolyzed condensate, or may be added as a partially hydrolyzed condensate of two or more kinds of compounds. Furthermore, a mixture of those compounds, the partially hydrolyzed condensate and the partially hydrolyzed condensate may be added. However, the partially hydrolyzed condensate and partially hydrolyzed condensate used have a degree of polymerization to an extent such that vacuum deposition is possible. The term "hydrolyzable silicon compound" used hereinafter is used in the meaning of including the partially hydrolyzed condensate and partially hydrolyzed condensate, in addition to the compound itself.

The fluorine-containing hydrolyzable silicon compound used to form the fluorine-containing organosilicon compound coating film may be any compound so long as the fluorine-containing organosilicon compound coating film obtained has antifouling properties such as water repellency and oil repellency.

Specific example of the fluorine-containing hydrolyzable silicon compound includes a fluorine-containing hydrolyzable silicon compound having at least one group selected from the group consisting of a perfluoropolyether group, a perfluoroalkylene group and a perfluoroalkyl group. Those groups are present as a fluorine-containing organic group bonded to silicon atom of a hydrolyzable silyl group through a linkage group or directly. Examples of preferable commercially available fluorine-containing hydrolyzable silicon compound containing at least one group selected from the group consisting of a perfluoropolyether group, a perfluoroalkylene group and a perfluoroalkyl group include KP-801 (trade name, manufactured by Shin-Etsu Chemical Co., Ltd.), X–71 (trade name, manufactured by Shin-Etsu Chemical Co., Ltd.), KY-130 (trade name, manufactured by Shin-Etsu Chemical Co., Ltd.), KY-178 (trade name, manufactured by Shin-Etsu Chemical Co., Ltd.), KY-185 (trade name, manufactured by Shin-Etsu Chemical Co., Ltd.), KY-195 (trade name, manufactured by Shin-Etsu Chemical Co., Ltd.), Afluid (registered trademark) S–550 (trade name, manufactured by AGC, Inc.) and Optool (registered trademark), DSX (trade name, manufactured by Daikin Industries, Ltd). Of those, KY-185, KY-195, Optool DSX and S–550 are more preferred.

When the commercially available fluorine-containing hydrolyzable silicon compound is supplied together with a solvent, the solvent is removed from the resulting mixture and the compound is used. The coating film forming composition is prepared by mixing the fluorine-containing hydrolyzable silicon compound and optional components added as necessary and is subjected to vacuum deposition.

The coating film forming composition containing a fluorine-containing hydrolyzable silicon compound is adhered to the surface of the antireflection layer 6, followed by reacting and depositing, thereby obtaining the fluorine-containing organosilicon compound coating film. As the specific vacuum deposition and reaction conditions, common methods and conditions can be applied.

(Modification of Formation Method of Antireflection Layer and Antifouling Layer)

The base layer part 6A in the outermost layer 61 in the antireflection layer 6, the layer upper part 6B in the outermost layer 61 and the antifouling layer 7 are formed by the first apparatus 31 and the second apparatus 32 separately, but those deposition may be conducted by a single apparatus, and the antireflection layer and the antifouling layer may be formed separately. In this case, fluorine may be supplied to the inside of the apparatus as necessary. For example, when the antireflection layer is formed by a single apparatus, the procedures up to the formation of the base layer part 6A are conducted as usual and when the layer upper part 6B is formed, fluorine may be supplied to the apparatus.

When fluorine atoms are contained in the silicon oxide layer, separately from the glass substrate 5, a fluorine-containing pressure-sensitive adhesive or a fluorine-containing material other than the pressure-sensitive adhesive 9 may be arranged on the main surface of the carrier substrate 10 on the side to which the glass substrate 5 is adhered. Examples of the fluorine-containing material include fluorine-containing resins such as a polytetrafluoroethylene (PTFE) resin, a tetrafluoroethylene-perfluoroalkoxyethylene copolymer (PFA) resin and a tetrafluoroethylene-ethylene copolymer (ETFE) resin, and fluorine-containing grease. In this case, the shape of the fluorine-containing resin can be appropriately designed into a film shape, a block shape or the like depending on production conditions and the like.

The method for forming each layer of the antireflection layer 6 is not limited to a sputtering method, and other deposition methods such as vacuum deposition, ion beam assist deposition, ion plating and plasma CVD can be used.

The method for forming the antifouling layer 7 is not limited to a deposition method. Examples of the method for forming the fluorine-containing organosilicon compound coating film include a method of applying a composition of a silane coupling agent having a perfluoroalkyl group or a fluoroalkyl group containing a perfluoro(polyoxyalkylene) chain to the surface of the antireflection layer 6 formed on the first main surface 2 of the glass substrate 5 by spin coating, dip coating, casting, slit coating, spray coating or the like and then heat-treating as necessary, and a vacuum deposition method of vapor phase-depositing the fluorine-containing organosilicon compound on the surface of the antireflection layer 6 and then heat-treating as necessary. To obtain the fluorine-containing organosilicon compound coating film having high adhesion, the coating film is preferably formed by vacuum deposition. The formation of the fluorine-containing organosilicon compound coating film by vacuum deposition is preferably conducted using the coating film forming composition containing the fluorine-containing hydrolyzable silicon compound.

(Modification of Formation of Antireflection Layer and Antifouling Layer)

The antireflection layer 6 and the antifouling layer 7 may be provided on the side of the second main surface 3 in place of the first main surface 2 of the glass substrate 5 or in addition to the first main surface 2. In this case, the antireflection layer 6 and the antifouling layer 7 may be provided up to the edge surfaces 4.

EXAMPLES

Examples of the present invention and Comparative Examples are described below. However, the present invention is not construed as being limited to the following examples.

Cases 1 to 9 are Examples of the present invention and Cases 10 and 11 are Comparative Examples.

Glass laminates were obtained by the following procedures of the respective cases using a plate-shaped glass DT having a thickness of 1.3 mm and a tetragon of a pair of facing main surfaces (Dragontrail (registered trademark) that is not subjected to strengthening treatment, manufactured by AGC, Inc., aluminosilicate glass for chemical strengthening) as a glass substrate.

The refractive index of each of the antireflection layer and the antifouling layer is known. Therefore, the thickness of those layers was measured using spectral reflectance.

(Case 1)

The glass substrate was subjected to (1) antiglare treatment, (2) chemical strengthening treatment, (3) alkali treatment, (4) formation of black print layer, (5) formation of antireflection layer (low reflection film) and (6) formation of antifouling layer, in this order with the following procedures, thereby obtaining a glass laminate.

(1) Antiglare Treatment (AG)

Antiglare treatment by frost treatment was applied to a first main surface of a glass substrate by the following procedures.

Acid-resistant protective film was adhered to a second main surface of the glass substrate to which antiglare treatment was not applied. The glass substrate was dipped in 3 mass % hydrogen fluoride aqueous solution for 3 minutes, and the first main surface of the glass substrate was etched to remove stains adhered to the surface. The glass substrate was dipped in a mixed aqueous solution of 15 mass % hydrogen fluoride and 15 mass % potassium fluoride to apply the frost treatment to the first main surface of the glass substrate. The glass substrate was dipped in 10 mass % hydrogen fluoride aqueous solution for 6 minutes to adjust the haze value of the first main surface to 25%. The haze value was measured using a haze meter (trade name: HZ—V3, manufactured by Suga Test Instruments Co., Ltd.) in accordance with JIS K 7136: 2000.

The glass substrate having been subjected to the antiglare treatment was cut into a size of 150 mm×250 mm and then subjected to a chemical strengthening treatment.

(2) Chemical Strengthening Treatment

The protective film adhered to the glass substrate was removed and the glass substrate was dipped in potassium nitrate salt heated and melted at 450° C., for 2 hours. The glass substrate was taken out of the molten salt and slowly cooled to room temperature over 1 hour to obtain a chemically strengthened glass substrate. The chemically strengthened glass substrate thus obtained had surface compressive stress (CS) of 730 MPa and depth of stress layer (DOL) of 30 μm.

(3) Alkali Treatment

The glass substrate was dipped in an alkali solution (Sun Wash TL-75, manufactured by Lion Corporation) to remove stains on the surface.

(4) Formation of Black Print Layer

Four sides of the periphery of the second surface of the glass substrate, to which the antiglare treatment was not applied, were printed in a black frame shape having a width of 2 cm by screen printing in the following procedures to form a black print layer. Black ink (trade name: GLSHF, manufactured by Teikoku Inks Printing Mgf. Co., Ltd.) as an organic ink containing pigment was applied to have a thickness of 5 μm by a screen printing machine, and maintained at 150° C. for 10 minutes for drying the ink. Thus, a first print layer was formed. The same black used above was applied to have a thickness of 5 μm to the first print layer in the same procedures as above, and maintained at 150° C. for 40 minutes for drying the ink. Thus, a second ink layer was formed. The black print layer including a laminate of the first print layer and the second print layer was formed as above, thereby obtaining a glass substrate having the black print layer on the outer periphery of the second main surface.

(5) Formation of Antireflection Layer

An anti reflection layer was formed on the first main surface and side surface, which have been subjected to the antiglare treatment, in the following method. In Case 1, the antireflection layer was formed with three high refractive index layers and three low refractive index layer, i.e. six layers in total (see FIG. 2A).

Double-sided polyimide tape (trade name: No. 6500, manufacture by Hitachi Maxell Co., Ltd.) having 20 mm width×400 mm length was adhered as a pressure-sensitive adhesive on the black print layer on the second main surface of the glass substrate. The glass substrate was adhered to a carrier substrate having a thickness of 2 mm and a size of 300 mm×1000 mm square, which was larger than the glass substrate.

The glass substrate was mounted on a drum in the state of being adhered to the carrier substrate, and a first apparatus was operated to form an antireflection layer up to a base layer part on the glass substrate.

Pulse sputtering was conducted under the conditions of a pressure of 0.3 Pa, frequency of 20 kHz, deposition power of 3.8 W/cm$^2$ and inverting pulse width of 5 μsec, using sputtering mechanism for high refractive index layer having a niobium oxide target (trade name: NBO target, manufactured by AGC Ceramics) placed therein while introducing a mixed gas obtained by mixing 10 vol % oxygen gas with argon gas, thereby forming the sixth layer 66 in FIG. 2A as a high refractive index layer having a thickness of 13 nm and containing niobium oxide as a main component. The deposition power was the same in the subsequent steps and was 3.8 W/cm$^2$.

Pulse sputtering was conducted using sputtering mechanism for low refractive index layer having a silicon target (manufactured by SOLERAS) having 10 mass % of aluminum added thereto placed therein while introducing a mixed gas obtained by mixing 40 vol % of oxygen gas with argon gas, thereby forming the fifth layer 65 as low refractive index layer having a thickness of 45 nm and containing aluminum-doped silicon oxide (Al—SiO$_2$) as a main component on the sixth layer 66.

Similar to the sixth layer 66, the fourth layer 64 was formed as a high refractive index layer having a thickness of 22 nm and containing niobium oxide as a main component on the fifth layer 65. Similar to the fifth layer 65, the third layer 63 was formed as a low refractive index having a thickness of 27 nm and containing Al—SiO$_2$ as a main component on the fourth layer 64. Similar to the fourth layer 64, second layer 62 was formed as a high refractive index layer having a thickness of 25 nm and containing niobium oxide as a main component on the third layer 63. Similar to the third layer 63, the outermost layer excluding a part of the outermost layer having a thickness of 58 nm and containing Al—SiO$_2$ as a main component, that is, the base layer part 6A of the outermost layer, was formed on the second layer 62.

The glass substrate including the antireflection layer 6 having layers formed up to the base layer part 6A was placed in the second apparatus 32 and the remaining deposition steps were carried out.

The layer upper part 6B having a thickness of 30 nm and containing SiO$_2$ as a main component was formed on the base layer part by operating the sputtering mechanism of the second apparatus, thereby forming the outermost layer 61 having a thickness of 88 nm and including the base layer part 6A having a thickness of 58 mm and the layer upper part 6B having a thickness of 30 nm. In Cases 1 to 9, the layer upper part 6B was an underlayer of the antifouling layer described hereinafter. In Case 1, the underlayer had a thickness of 30 nm.

Thus, the antireflection layer including three high refractive index layers containing niobium oxide as a main component and three low refractive index layers containing Al—SiO$_2$ as a main component, i.e. six layers in total, in which the surface layer side of the outermost layer was SiO$_2$, was formed.

(6) Formation of Antifouling Layer (AFP Layer)

Antifouling layer was formed on the layer upper part of the outermost layer by operating a deposition apparatus of the second apparatus.

A material for forming a fluorine-containing organosilicon compound film was introduced as a material of the antifouling layer into a heating vessel of the second apparatus. The inside of the heating vessel was deaerated with a vacuum pump for 10 hours or more to remove a solvent in a solution, thereby obtaining a composition for forming a fluorine-containing organosilicon compound film (hereinafter referred to as an antifouling layer forming composition). KY-185 (manufactured by Shin-Etsu Chemical Co., Ltd.) was used as the antifouling layer forming composition.

The heating vessel containing the antifouling layer forming composition therein was heated to 270° C. After reaching 270° C., the state was maintained for 10 minutes until the temperature was stabilized. The glass substrate having the antireflection layer formed thereon was placed in a vacuum chamber, and the antifouling layer forming composition was supplied toward the antireflection layer of the glass plate from a manifold connected to the heating vessel containing the antifouling layer forming composition therein, followed by conducting deposition.

The deposition was conducted while measuring a thickness by a crystal oscillator monitor arranged in the vacuum chamber and was conducted until a thickness of the fluorine-containing organosilicon compound film on the antireflection layer reached 4 nm. The glass substrate taken out of the vacuum chamber was placed on a hotplate such that the fluorine-containing organosilicon compound film surface faced upward, followed by heat-treating at 150° C. for 60 minutes in the air.

(Case 2)

A glass substrate in Case 2 was formed under the same conditions as in Case 1, except for using two high refractive index layers and two low refractive layers and changing the thickness of each layer. The thickness of the fourth layer was 13 nm, the thickness of the third layer was 35 nm, the thickness of the second layer was 115 nm, the thickness of the outermost layer was 80 nm, and the thickness of the layer upper part of the outermost layer was 10 nm. The layer upper part was an underlayer.

(Case 3)

A glass laminate in Case 3 was formed under the same conditions as in Case 2, except for changing the main component of the low refractive index layer and the thickness of each part constituting the outermost layer. The main component of the outermost layer and third layer that are the low refractive index layer was changed to SiO$_2$ (silicon oxide). The low refractive index layer containing the silicon oxide as the main component was formed using a silicon target (manufactured by AGC Ceramics). The thickness of the outermost layer was 80 nm, and the thickness of the layer upper part thereof was 30 nm.

(Case 4)

A glass laminate in Case 4 was formed under the same conditions as in Case 2, except for changing the main component of the base layer part of the outermost layer and the third layer that are the low refractive index layer to silicon oxide.

(Case 5)

A glass laminate in Case 5 was formed under the same conditions as in Case 3, except for using five high refractive index layers and five low refractive index layers and changing the thickness of each layer. The thickness of the tenth, eighth, sixth, fourth and second layers that are the high refractive index layers were 13 nm, 110 nm, 10 nm, 10 nm and 100 nm, respectively, and the thickness of the ninth, seventh, fifth and third layers and the outermost layer that are the low refractive index layers were 32 nm, 32 nm, 97 nm, 25 nm and 77 nm, respectively, and the thickness of the layer upper part of the outermost layer was 30 nm.

(Case 6)

A glass laminate in Case 6 was formed under the same conditions as in Case 3, except that the antifouling treatment was not conducted.

(Case 7)

A glass laminate in Case 7 was formed under the same conditions as in Case 3, except for using one high refractive index layer and one low refractive index layer and changing the thickness of each layer. The thickness of the second layer was 115 nm, the thickness of the outermost later was 110 nm, and the thickness of the layer upper part of the outermost layer was 30 nm.

(Case 8)

A glass laminate in Case 8 was formed under the same conditions as in Case 1, except for using three high refractive index layers and three low refractive layers and changing the thickness of each layer. The thickness of the sixth layer was 13 nm, the thickness of the fifth layer was 45 nm, the thickness of the fourth layer was 22 nm, the thickness of the third layer as 27 nm, the thickness of the second layer was 25 nm, the thickness of the outermost layer was 120 nm, and the thickness of the layer upper part of the outermost layer was 30 nm.

(Case 9)

A glass laminate in Case 9 was formed under the same conditions as in Case 8, except that the elements other than the number of layers were changed. The thickness of the sixth layer was 13 nm, the thickness of the fifth layer was 25 nm, the thickness of the fourth layer was 30 nm, the thickness of the third layer was 25 nm, the thickness of the second layer was 15 nm, the thickness of the outermost layer was 70 nm, and the thickness of the layer upper part of the outermost layer was 30 nm. Furthermore, the main component of each of the base layer part of the outermost layer, the third layer and the fifth layer was Al—$SiO_2$.

(Case 10)

A glass laminate in Case 10 was formed under the same conditions as in Case 3, except for changing the formation method of the outermost layer as the low refractive index layer, the structure of the outermost layer and the formation method of the antifouling layer. The entire outermost layer was formed using the first apparatus, and its thickness was 80 nm.

(Case 11)

A glass laminate in Case 11 was formed under the same conditions as in Case 2, except for changing the formation method of the outermost layer as the low refractive index layer, the structure of the outermost layer and the formation method of the antifouling layer. The entire outermost layer was formed using the first apparatus, and its thickness was 80 nm.

The glass laminates obtained in Cases 1 to 11 were evaluated as follows.

(Measurement of Peak of Fluorine Concentration in Antireflection Layer)

The antifouling layer formed in the glass laminate and surface organic contamination are removed. For the removal, oxygen plasma treatment was carried out and ultraviolet (UV) ozone treatment was then carried out. Any one of those treatments may be carried out depending on the thickness of the antifouling layer and the degree of surface organic contamination.

Low temperature asher (LTA-102 Model, manufactured by Yanaco Co., Ltd.) was used in the oxygen plasma treatment. The treatment conditions were as follows: high-frequency output: 50 W, oxygen flow rate: 50 ml/min and treatment time: 60 minutes.

In the UV ozone treatment, UV irradiation device PL30-200 (manufactured by Sen Engineering Co., Ltd.) was used, and UB2001D-20 was used as a power source of the UV irradiation device. The treatment conditions were as follows: ultraviolet ray wavelength: 254 nm and treatment time: 10 minutes.

By confirming with X-ray photoelectron spectroscopy that a peak of fluorine is not present in the glass laminate after completion of the UV ozone treatment, it can be confirmed that the antifouling layer on the surface has been removed.

The glass substrate is measured with secondary ion mass spectrometry (SIMS) in accordance with the following procedures.

Sample to be measured is conveyed to SIMS apparatus and measured in order, and profiles in a depth direction of secondary ion intensity of fluorine ($^{19}F^-$), silicon ($^{30}Si-$), niobium having oxygen added thereto ($^{93}Nb^- + ^{16}O^-$), aluminum ($^{27}Al^-$) and oxygen($^{18}O^-$) are obtained. SIMS is measured using ADEPT1010 (manufactured by Ulkvac-Phi, Inc.). The measurement conditions of SIMS are as follows: primary ion species: $Cs^+$, accelerated voltage: 5 kV, current value: 50 nA, incident angle: 60° with respect to normal line of sample face and luster size of primary ion: 400 μm×400 μm, and primary ion irradiation is conducted under the conditions. Regarding the detection of secondary ion, the secondary ion having minus polarity is detected under the conditions that detection range is 80 μm×80 μm (4% of luster size of primary ion), field aperture of the detector is set to 1 and field axis potential of secondary ion measured is set to 0. In this case, neutralizer is used. The inside of the apparatus is preferably high vacuum state as possible in order to ensure measurement accuracy. The main chamber before initiation of measurement of SIMS had a degree of vacuum of 3.0×10$^{-7}$ Pa. Similar to the degree of vacuum of the apparatus, the measurement is preferably conducted under the condition of high sputtering rate as possible in order to ensure measurement accuracy.

Figure 8:
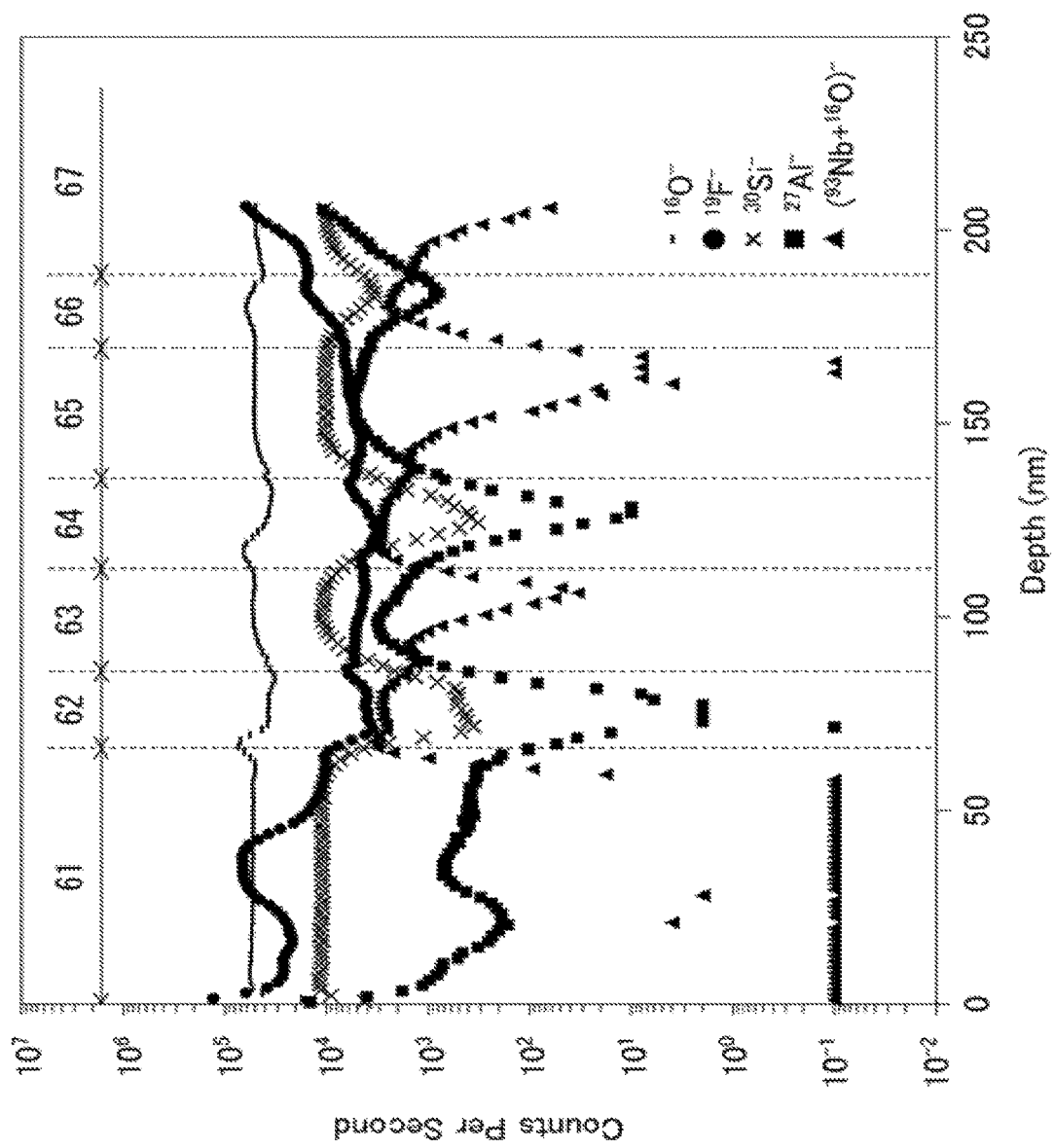
FIG. 8 is a graph showing the relationship between each layer of an antireflection layer and atoms contained in each of the layers.

The measurement results of Case 1 by SIMS are shown in FIG. 8. In the graph of FIG. 8, based on the output from SIMS, a depth from the surface of the antireflection layer is shown by X axis and secondary ion intensity is shown by Y axis. 61 shows the position corresponding to the outermost layer, 62 to 66 show the positions of second to sixth layers, respectively, and 67 shows the position corresponding to the glass substrate 5. In Cases 2 to 11, the measurement results by SIMS are obtained in the same manners as in Case 1.

The distribution of fluorine concentration in the outermost layer 61, that is, the presence or absence of peak P in a secondary ion intensity curve, was confirmed by the following procedures.

Figure 9:
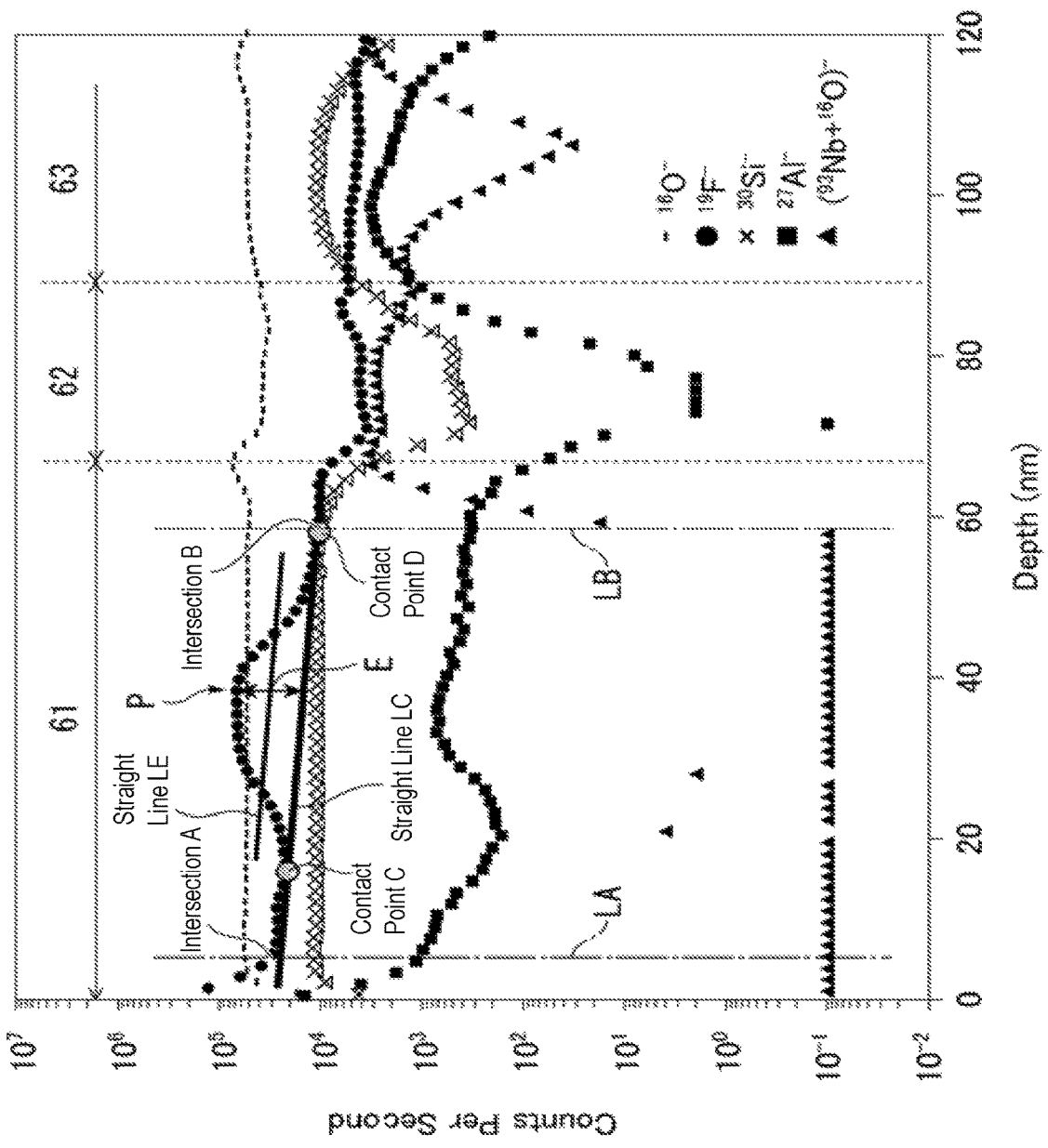
FIG. 9 is an enlarged view of a major part of FIG. 8 for explaining a peak of distribution of fluorine concentration inside an outermost layer.

The definition of the peak P of the distribution of fluorine concentration in the outermost layer is described based on FIG. 9. FIG. 9 is an enlarge view of a major part of FIG. 8.

(1) Straight line LA is set in parallel to Y axis at the measurement point at which secondary ion intensity of silicon ($^{30}Si^-$) and secondary ion intensity of oxygen ($^{18}O^-$) in the outermost layer 61 does not change greatly and begins to be flat when observed toward a depth direction from the surface of the antireflection layer, that is, a direction of the glass substrate, and an intersection of the straight line LA and the secondary ion intensity of fluorine ($^{19}F^-$) is indicated as A.

(2) Straight line LB is set in parallel to Y axis at the point at which the secondary ion intensity of niobium ($^{93}Nb^-$ + $^{16}O^-$) to which oxygen was added, in the second layer 62 rapidly rises and from which the secondary ion intensity of silicon ($^{30}Si^-$) start to decrease, and an intersection of the straight line LB and the secondary ion intensity curve of fluorine ($^{19}F^-$) is designated as B.

(3) Straight line LC contacting from below with secondary ion intensity curve of fluorine in a range connecting the intersection A and the intersection B is set. The point with which the straight line LC contacts from below is two minimum values on the secondary ion intensity curve and is the point at which the secondary ion intensity curve does not intersect with a line connecting those minimum values. In FIG. 9, two minimum values are present on the secondary ion intensity curve between the intersection A and the intersection B, and a line segment connecting those minimum values from below is the straight line LC. When the secondary ion intensity curve is complicated and a plurality of straight lines connecting two contact points are present, a straight line having the largest distance between two points is the straight line LC.

(4) The point giving the maximum value of the secondary ion intensity curve of fluorine ($^{19}F^-$) within the section of two contact points C and D of the straight line LC set in (3) above and the secondary ion intensity curve of fluorine ($^{19}F^-$), that is, between the contact point C and the contact point D, is determined. When a plurality of contact points becoming a candidate of the maximum value are present, the point farthest from the straight line LC set in (3) on the Y axis is used.

(5) The distance between the point giving the maximum value set in (4) and the point corresponding to a depth of the maximum value on the straight line LC set in (3) is divided equally, and a straight line LE in parallel to the straight line LC set in (3) is set so as to pass through the equally dividing point E.

(6) When the straight line LE set in (5) intersects with the secondary ion intensity curve of fluorine at one or two points between the contact point C and the contact point D, a point giving the maximum value set in (4) is the peak P. On the other hand, when the secondary ion intensity curve of fluorine ($^{19}F^-$) intersects with the straight line LE at three or more points or when the secondary ion intensity curve gently changes and does not have the minimum value, the peak P is not present.

The same concentration measurement as in Case 1 was conducted in Cases 2 to 11.

(Measurement of Scratch Rubbing Resistance)

The antireflection layer of the glass laminates in Cases 1 to 11 was scratched with a cutter. In this case, scratches reaching the antireflection layer through the antifouling layer were formed in the glass laminates in Cases 1 to 9. A wiper (SHELLPER, manufactured by Ozu Corporation) was wound on an indenter of 1 cm$^2$, and the glass laminate was rubbed with the wiper at a speed of 50 mm/sec and a stroke of 40 mm for 1 minute while applying a load of 20N. After the rubbing test, occurrence of peeling of the film at the vicinity of scratches was confirmed with a microscope of 100 magnifications. The results are shown in Tables 1 and 2. In Tables 1 and 2, the state that the film is not peeled is indicated by "OK" and the state that the film is peeled is indicated by "NG".

(Measurement of Luminous Reflectance)

Spectral reflectance of the region facing the black print layer of the glass laminate was measured with a spectrophotometer (Model: CM-2600d, manufactured by Konica Minolta Inc.) and luminous reflectance (stimulus value Y defined in JIS Z8710: 1999) was obtained from the spectral reflectance. The results are shown in Tables 1 and 2.

The information of each treatment and evaluation results for the glass laminates in Cases 1 to 11 are shown in Tables 1 and 2. In the columns of the "antiglare treatment" and the "chemical strengthening treatment" in Tables 1 and 2, the case where the treatment was conducted is shown by "Done" and the case where the treatment was not conducted is shown by "None". In the column of the "black print layer", the case where the black print layer was formed is shown by "Formed" and the case where the black print layer was not printed is shown by "None".

TABLE 1

| | | Case 1 | Case 2 | Case 3 | Case 4 | Case 5 |
|---|---|---|---|---|---|---|
| Glass substrate | Kind | DT | DT | DT | DT | DT |
| | Thickness | 1.3 mm | 1.3 mm | 1.3 mm | 1.3 mm | 1.3 mm |
| Antiglare treatment | | Done | Done | Done | Done | Done |
| Chemical strengthening treatment | | Done | Done | Done | Done | Done |
| Black print layer | | Formed | Formed | Formed | Formed | Formed |
| Antireflection layer/thickness Deposition powder is unified in 3.8 W/cm$^2$ | | 6$^{th}$ layer: Nb$_2$O$_5$ 13 nm 5$^{th}$ layer: Al—SiO$_2$ 45 nm 4$^{th}$ layer: Nb$_2$O$_5$ 22 nm 3$^{rd}$ layer: Al—SiO$_2$ 27 nm 2$^{nd}$ layer: Nb$_2$O$_5$ 25 nm | 4$^{th}$ layer: Nb$_2$O$_5$ 13 nm 3$^{rd}$ layer: Al—SiO$_2$ 35 nm 2$^{nd}$ layer: Nb$_2$O$_5$ 115 nm Outermost layer: 80 nm (base layer part: Al—SiO$_2$ 70 nm, layer upper part: SiO$_2$ 10 nm) | 4$^{th}$ layer: Nb$_2$O$_5$ 13 nm 3$^{rd}$ layer: SiO$_2$ 35 nm 2$^{nd}$ layer: Nb$_2$O$_5$ 115 nm Outermost layer: 80 nm (base layer part: SiO$_2$ 50 nm, layer upper part: SiO$_2$ 30 nm) | 4$^{th}$ layer: Nb$_2$O$_5$ 13 nm 3$^{rd}$ layer: SiO$_2$ 35 nm 2$^{nd}$ layer: Nb$_2$O$_5$ 115 nm Outermost layer: 80 nm (base layer part: SiO$_2$ 70 nm, layer upper part: SiO$_2$ 10 nm) | 10$^{th}$ layer: Nb$_2$O$_5$ 13 nm 9$^{th}$ layer: SiO$_2$ 32 nm 8$^{th}$ layer: Nb$_2$O$_5$ 110 nm 7$^{th}$ layer: SiO$_2$ 32 nm 6$^{th}$ layer: Nb$_2$O$_5$ 10 nm |

TABLE 1-continued

|  | | Case 1 | Case 2 | Case 3 | Case 4 | Case 5 |
|---|---|---|---|---|---|---|
| | | Outermost layer: 88 nm (base layer part: Al—SiO$_2$ 58 nm, layer upper part: SiO$_2$ 30 nm) | — | — | — | 5$^{th}$ layer: SiO$_2$ 97 nm 4$^{th}$ layer: Nb$_2$O$_5$ 10 nm |
| | | — | — | — | — | 3$^{rd}$ layer: SiO$_2$ 25 nm 2$^{nd}$ layer: Nb$_2$O$_5$ 100 nm Outermost layer: 77 nm (base layer part: SiO$_2$ 47 nm, layer upper part: SiO$_2$ 30 nm) |
| Antifouling layer (AFP layer) | Treatment before deposition | APR material is injected into chamber in the state that substrate at the position of SiO$_2$ deposition is present | | | | |
| | Antifouling layer material | KY-185, Shin-Etsu Chemical | KY-185, Shin-Etsu Chemical | KY-185, Shin-Etsu Chemical | KY-185, Shin-Etsu Chemical | KY-185, Shin-Etsu Chemical |
| | Thickness | 4 nm | 4 nm | 4 nm | 4 nm | 4 nm |
| SIMS measurement | Peak of fluorine concentration | Presence | Presence | Presence | Presence | Presence |
| Scratch rubbing resistance | | OK | OK | OK | OK | OK |
| Luminous reflectance | | 0.75% | 0.80% | 0.80% | 0.80% | 0.73% |

TABLE 2

|  | | Case 6 | Case 7 | Case 8 | Case 9 | Case 10 | Case 11 |
|---|---|---|---|---|---|---|---|
| Glass substrate | Kind | DT | DT | DT | DT | DT | DT |
| | Thickness | 1.3 mm | 1.3 mm | 1.3 mm | 1.3 mm | 1.3 mm | 1.3 mm |
| | Antiglare treatment | None | Done | Done | Done | Done | Done |
| | Chemical strengthening treatment | Done | Done | Done | Done | Done | Done |
| | Black print layer | Formed | Formed | Formed | Formed | Formed | Formed |
| Antireflection layer/ thickness Deposition power is unified in 3.8 W/cm$^2$ | | 4$^{th}$ layer: Nb$_2$O$_5$ 13 nm 3$^{rd}$ layer: SiO$_2$ 35 nm 2$^{nd}$ layer: Nb$_2$O$_5$ 115 nm Outermost layer: 80 nm (base layer part: SiO$_2$ 50 nm, layer upper part: SiO$_2$ 30 nm) | 2$^{nd}$ layer: Nb$_2$O$_5$ 115 nm Outermost layer: 110 nm (base layer part: SiO$_2$ 80 nm, layer upper part: SiO$_2$ 30 nm) | 6$^{th}$ layer: Nb$_2$O$_5$ 13 nm 5$^{th}$ layer: Al—SiO$_2$ 45 nm 4$^{th}$ layer: Nb$_2$O$_5$ 22 nm 3$^{rd}$ layer: Al—SiO$_2$ 27 nm 2$^{nd}$ layer: Nb$_2$O$_5$ 25 nm Outermost layer: 120 nm (base layer part: Al—SiO$_2$ 90 nm, layer upper part: SiO$_2$ 30 nm) | 6$^{th}$ layer: Nb$_2$O$_5$ 13 nm 5$^{th}$ layer: Al—SiO$_2$ 25 nm 4$^{th}$ layer: Nb$_2$O$_5$ 30 nm 3$^{rd}$ layer: Al—SiO$_2$ 25 nm 2$^{nd}$ layer: Nb$_2$O$_5$ 15 nm Outermost layer: 70 nm (base layer part: Al—SiO$_2$ 40 nm, layer upper part: SiO$_2$ 30 nm) | 4$^{th}$ layer: Nb$_2$O$_5$ 13 nm 3$^{rd}$ layer: SiO$_2$ 35 nm 2$^{nd}$ layer: Nb$_2$O$_5$ 115 nm Outermost layer: SiO$_2$ 80 nm | 4$^{th}$ layer: Nb$_2$O$_5$ 13 nm 3$^{rd}$ layer: Al—SiO$_2$ 35 nm 2$^{nd}$ layer: Nb$_2$O$_5$ 115 nm Outermost layer: Al—SiO$_2$ 80 nm |
| Antifouling layer (AFP layer) | Treatment before deposition | APR material is injected into chamber in the state that substrate at the position of SiO$_2$ deposition is present | | | | | |
| | Antifouling layer material | KY-185, Shin-Etsu Chemical | KY-185, Shin-Etsu Chemical | KY-185, Shin-Etsu Chemical | KY-185, Shin-Etsu Chemical | KY-185, Shin-Etsu Chemical | KY-185, Shin-Etsu Chemical |
| | Thickness | 4 nm | 4 nm | 4 nm | 4 nm | 4 nm | 4 nm |
| SIMS measurement | Peak of fluorine concentration | Presence | Presence | Presence | Presence | None | None |
| Scratch rubbing resistance | | OK | OK | OK | OK | NG | NG |
| Luminous reflectance | | 0.80% | 1.50% | 1.20% | 0.90% | 0.80% | 0.80% |

As shown in FIG. 8, the secondary ion intensity of fluorine in a thickness direction of the antireflection layer had peak P inside the outermost layer 61. The concentration of fluorine F was decreased in the second layer 62 as compared with the outermost layer 61, the concentration of fluorine in the third layer 63 was within the range between the second layer 62 and the outermost layer 61, the concentration of fluorine in the fourth layer 64 was lower than that in the third layer 63, and the concentration of fluorine in the fifth layer 65 was nearly the same as that in the third layer 63.

The secondary ion intensity of aluminum Al in the second layer 62 was lower than that in the outermost layer 61, the secondary ion intensity of Al in the third layer 63 was higher than that in the outermost layer, the secondary ion intensity of Al in the fourth layer was lower than that in the third layer, the secondary ion intensity of Al in the fifth layer was higher than that in the fourth layer, and the secondary ion intensity of Al in the sixth layer was lower than that in the fifth layer.

The secondary ion intensity of oxygen (O) is almost the same in each layer, but is slightly increased in the boundary part between the outermost layer 61 and the second layer 62 and the boundary part between the third layer 63 and the fourth layer 64.

The secondary ion intensity of niobium having oxygen (O) added thereto ($Nb^-+O^-$) shows low value in the outermost layer 61, but is increased in the boundary part between the outermost layer 61 and the second layer 62, is decreased from the second layer 62 to the middle of the third layer 63, is again increased from the middle of the third layer 63 to the boundary part between the third layer 63 and the fourth layer 64, is again decreased from the boundary part between the third layer 63 and the fourth layer 64 to the middle of the fifth layer 65 and is again increased in the sixth layer 66.

The peak of secondary ion intensity of fluorine was observed in the outermost layer in Cases 1 to 9, but the peak of secondary ion intensity of fluorine F was not observed in Cases 10 and 11.

The reason of the difference in secondary ion intensity of fluorine F is considered as follows.

In Cases 1 to 9, the base layer part of the outermost layer in the antireflection layer was formed by the first apparatus and the layer upper part was formed by the second apparatus. Therefore, fluorine atoms remained in the second apparatus after deposition of the antifouling layer were incorporated in the layer upper part and as a result, the peak P was present inside the outermost layer 61. On the other hand, in Cases 10 and 11, the entire outermost layer of the antireflection layer was formed by the first apparatus. It is therefore considered that the peak P was not present inside the outermost layer 61.

It is considered from the above results that the thickness of the layer upper part 6B is preferably 5 nm or more and 60 nm or less. When the thickness of the layer upper part 6B is 5 nm or more, density of silanol groups to be reacted with the antifouling layer is appropriate and satisfactory water repellency is achieved. On the other hand, the thickness of the layer upper part 6B being 60 nm or less is appropriate from the standpoint that the layer upper part 6B itself has the effect of stress relaxation. The thickness of the layer upper part 6B is preferably 10 nm or more and 50 nm or less, more preferably 10 nm or more and 40 nm or less, and most preferably 10 nm or more and 30 nm or less.

Regarding the scratch rubbing resistance, peeling of the film did not occur in Cases 1 to 9, but peeling of the film occurred in Cases 10 and 11. The reason thereof is considered to be as follows.

It is considered in Cases 1 to 9 that the peak of distribution of fluorine F is present in the outermost layer of the antireflection layer, and therefore, the progress of scratches on the outermost layer is prevented in the part having a high fluorine concentration and the scratches are prevented from propagating up to the layer of the glass substrate side. On the other hand, it is considered in Cases 10 and 11 that the peak of distribution of fluorine F is not present in the outermost layer of the antireflection layer, and therefore, the progress of scratches in the outermost layer is not prevented and the scratches are propagated up to the layer of the glass substrate side.

Visual reflectance was 0.73 to 1.20% in Cases 1 to 9 and there was no problem.

When the present invention are described in detail and with reference to specific embodiments thereof, it is apparent to one skilled in the art that various changes and modifications may be made therein without departing from the spirit and scope thereof 1 Glass laminate
2 First main surface
3 Second main surface
31 First apparatus
32 Second apparatus
4 Edge surface
5 Glass substrate
6 Antireflection layer
61 Outermost layer
6A Base layer part
6B Layer upper part
62 Second layer
63 Third layer
64 Fourth layer
65 Fifth layer
66 Sixth layer
7 Antifouling layer
8 Print layer
9 Pressure-sensitive adhesive
10 Carrier substrate
P Peak

The invention claimed is:

1. A glass laminate, comprising:
a glass substrate including a first main surface and a second main surface;
an antireflection layer on at least one of the first main surface and the second main surface, the antireflection layer including at least one low refractive index layer and at least one high refractive index layer, the low refractive index layer and the high refractive index layer being alternately laminated; and
an antifouling layer on the antireflection layer,
wherein an outermost layer of the antireflection layer that is farthest from the glass substrate is the low refractive index layer including $SiO_2$ as a main component, and
a distribution of fluorine concentration in a thickness direction of the outermost layer, measured by secondary ion mass spectrometry, has a peak.

2. The glass laminate according to claim 1, wherein the antifouling layer includes a fluorine atom.

3. The glass laminate according to claim 1, wherein the outermost layer has a thickness of 60 nm or more acid 130 nm or less.

4. The glass laminate according to claim 1, wherein the number of the low refractive index layer in the antireflection layer is 1 or more and 6 or less, and the number of the high refractive index layer in the antireflection layer is equal to that of the low refractive index layer.

5. The glass laminate according to claim 4, wherein the number of each of the low refractive index layer and the high refractive index layer in the antireflection layer is 1, and a main component of the high refractive index layer is any one of SiN, $TiO_2$, $Nb_2O_5$, $Ta_2O_5$ and $ZrO_2$.

6. The glass laminate according to claim 4, wherein the number of each of the low refractive index layer and the high refractive index layer in the antireflection layer is 2 or more and 6 or less,
- a main component of the high refractive index layer is any one of SiN, $TiO_2$, $Nb_2O_5$, $Ta_2O_5$ and $ZrO_2$, and
- the main component of all of the high refractive index layers is the same or the main component of at least one of the high refractive index layers is different from the main component of the other high refractive index layer(s).

7. The glass laminate according to claim 1, wherein the antifouling layer is formed from a fluorine-based silane coupling material.

8. The glass laminate according to claim 7, wherein the number of each of the low refractive index layer and the high refractive index layer in the antireflection layer is 2 or more and 6 or less,
- a content of the $SiO_2$ in a range from the outermost surface of the outermost layer to a depth of 5 nm from the outermost surface is 95 mass % or more, and
- a main component of the low refractive index layer(s) other than the outermost layer is Al—$SiO_2$.

9. The glass laminate according to claim 1, wherein antiglare processing has been applied to the main surface of the glass substrate on which the antireflection layer is laminated.

10. A front plate for display, comprising the glass laminate according to claim 1.

11. A display device, comprising the front plate for display according to claim 10.

12. A method for manufacturing a glass laminate,
wherein the glass laminate comprises:
- a glass substrate including a first main surface and a second main surface;
- an antireflection layer on at least one of the first main surface and the second main surface, the antireflection layer including at least one low refractive index layer and at least one high refractive index layer, the low refractive index layer and the high refractive index layer being alternately laminated; and
- an antifouling layer that is in contact with antireflection layer and includes a fluorine atom, wherein an outermost layer of the antireflection layer that is farthest from the glass substrate and the outermost layer is the low refractive index layer including $SiO_2$ as a main component, wherein the method comprises:
- forming the outermost layer excluding a part of the outermost layer in a thickness direction in the antireflection layer above the glass substrate by a first apparatus; and
- continuously forming the part of the outermost layer in a thickness direction and the antifouling layer by a second apparatus different from the first apparatus.

* * * * *